United States Patent
Chen et al.

(10) Patent No.: US 10,523,368 B2
(45) Date of Patent: Dec. 31, 2019

(54) POLAR CODE PROCESSING METHOD AND COMMUNICATIONS DEVICE

(71) Applicant: Huawei Technologies Co., Ltd., Shenzhen, Guangdong (CN)

(72) Inventors: Kai Chen, Shenzhen (CN); Bin Li, Shenzhen (CN); Jie Jin, Shenzhen (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/006,751

(22) Filed: Jun. 12, 2018

(65) Prior Publication Data
US 2018/0294920 A1    Oct. 11, 2018

Related U.S. Application Data

(63) Continuation of application No. PCT/CN2016/106237, filed on Nov. 17, 2016.

(30) Foreign Application Priority Data

Dec. 18, 2015 (CN) .......................... 2015 1 0957721

(51) Int. Cl.
*H03M 13/00* (2006.01)
*H04L 1/00* (2006.01)
*H03M 13/13* (2006.01)

(52) U.S. Cl.
CPC .......... *H04L 1/0058* (2013.01); *H03M 13/13* (2013.01); *H03M 13/635* (2013.01);
(Continued)

(58) Field of Classification Search
CPC ... H04L 1/0058; H04L 1/0041; H04L 1/0043; H04L 1/0057; H03M 13/13; H03M 13/635
See application file for complete search history.

(56) References Cited

U.S. PATENT DOCUMENTS 6,105,158 A * 8/2000 Chen ..................... H03M 13/09
                                                          714/755
6,215,827 B1 * 4/2001 Balachandran ....... H04L 1/0003
                                                          375/262
(Continued)

FOREIGN PATENT DOCUMENTS

CN    102122966 A    7/2011
CN    102164025 A    8/2011
(Continued)

OTHER PUBLICATIONS

Mostafa El-Khamy et al.,"HARQ Rate-Compatible Polar Codes for Wireless Channels",arXiv: 1508.07698v1,dated Aug. 31, 2015,total 6 pages.
(Continued)

*Primary Examiner* — Esaw T Abraham
(74) *Attorney, Agent, or Firm* — Womble Bond Dickinson (US) LLP

(57) ABSTRACT

Embodiments of the present invention disclose a polar code processing method and communications device. The method includes: obtaining, based on a target coded bit quantity M and preset first mapping relationship information, a first sequence number set of M uncoded bits that is corresponding to the target coded bit quantity M, the first mapping relationship information is used to indicate a one-to-one correspondence between a plurality of coded bit quantities and a plurality of uncoded bit sequence number sets, the M uncoded bits include K information bits, and M target coded bits are obtained after polar encoding is performed on the M uncoded bits; and selecting, from the first sequence number set of the M uncoded bits according to a preset first selection rule, K sequence numbers as a sequence number set of the K information bits.

19 Claims, 7 Drawing Sheets

(52) U.S. Cl.
CPC .......... *H04L 1/0041* (2013.01); *H04L 1/0043* (2013.01); *H04L 1/0057* (2013.01); *H04L 1/0013* (2013.01); *H04L 1/0068* (2013.01)

(56) References Cited

U.S. PATENT DOCUMENTS

| | | | | |
|---|---|---|---|---|
| 6,507,927 B1* | 1/2003 | Kalliojarvi | ........ | H03M 13/4138 714/795 |
| 8,245,116 B2* | 8/2012 | Orlik | ................ | H03M 13/136 714/780 |
| 8,811,509 B2* | 8/2014 | Shen | .................... | H04L 1/0058 332/103 |
| 9,467,164 B2* | 10/2016 | Ionita | .................. | H04L 25/4917 |
| 9,742,440 B2* | 8/2017 | El-Khamy | ........ | H03M 13/6368 |
| 9,768,915 B2* | 9/2017 | Kim | ...................... | H03M 13/09 |
| 9,954,645 B2* | 4/2018 | Ahn | ...................... | H04L 1/0041 |
| 10,135,460 B2* | 11/2018 | Ionita | ...................... | H03M 5/18 |
| 2013/0117344 A1* | 5/2013 | Gross | ...................... | G06F 17/10 708/490 |
| 2013/0283116 A1 | 10/2013 | Arikan | | |
| 2014/0108748 A1 | 4/2014 | Lee et al. | | |
| 2015/0026543 A1 | 1/2015 | Li et al. | | |
| 2015/0194987 A1 | 7/2015 | Li et al. | | |
| 2015/0333775 A1 | 11/2015 | Korb et al. | | |
| 2016/0254876 A1 | 9/2016 | Shen et al. | | |
| 2016/0269050 A1 | 9/2016 | Shen et al. | | |
| 2016/0352464 A1 | 12/2016 | Shen et al. | | |

FOREIGN PATENT DOCUMENTS

| | | |
|---|---|---|
| CN | 103023618 A | 4/2013 |
| CN | 103368583 A | 10/2013 |
| CN | 103684477 A | 3/2014 |
| CN | 105164959 A | 12/2015 |
| WO | 2015066925 A1 | 5/2015 |
| WO | 2015074192 A1 | 5/2015 |

OTHER PUBLICATIONS

3GPP TS 36.212 V12.7.0 (Dec. 2015);3rd Generation Partnership Project;Technical Specification Group Radio Access Network;Evolved Universal Terrestrial Radio Access (E-UTRA);Multiplexing and channel coding(Release 12),total 94 pages.

3GPP TS 36.213 V12.8.0 (Dec. 2015);3rd Generation Partnership Project;Technical Specification Group Radio Access Network;Evolved Universal Terrestrial Radio Access (E-UTRA);Physical layer procedures(Release 12),total 241 pages.

* cited by examiner

400

| Obtain, based on a target coded bit quantity M and preset first mapping relationship information, a first sequence number set of M uncoded bits that is corresponding to the target coded bit quantity M, where the first mapping relationship information is used to indicate a one-to-one correspondence between a plurality of coded bit quantities and a plurality of uncoded bit sequence number sets, the M uncoded bits include K information bits, M target coded bits are obtained after polar encoding is performed on the M uncoded bits, and N bits in the M coded bits are transmitted on an actual channel, where $M \geq K$, $M=2^n$, and n, N, and K are positive integers | ~ 410 |

| Select, from the first sequence number set of the M uncoded bits according to a preset first selection rule, K sequence numbers as a sequence number set of the K information bits, where the K sequence numbers are used to represent positions of the K information bits in the M uncoded bits | ~ 420 |

Obtain, based on a coded bit quantity M and preset second mapping relationship information, a second coded bit sequence number set that is corresponding to the coded bit quantity M and whose quantity is $M_0$, where the second mapping relationship information is used to indicate a one-to-one correspondence between a plurality of coded bit quantities and a plurality of coded bit sequence number sets, a sequence number quantity of each coded bit sequence number set is greater than or equal to a coded bit quantity corresponding to the coded bit sequence number set, M target coded bits are obtained after polar encoding is performed on M uncoded bits, the M uncoded bits include K information bits, and N bits in the M coded bits are transmitted on an actual channel, where $M_0 \geq M$, $M \geq K$, $M=2^n$, and n, N, K, and $M_0$ are positive integers ~ 510

Select, from the second coded bit sequence number set according to a preset second selection rule, N sequence numbers as sequence numbers of the N transmission bits, where the sequence numbers of the N transmission bits are used to represent positions of the N transmission bits in the M coded bits ~ 520

FIG. 5

POLAR CODE PROCESSING METHOD AND COMMUNICATIONS DEVICE

CROSS-REFERENCE TO RELATED APPLICATIONS

This application is a continuation of International Application No. PCT/CN2016/106237, filed on Nov. 17, 2016, which claims priority to Chinese Patent Application No. 201510957721.6, filed on Dec. 18, 2015, The disclosures of the aforementioned applications are hereby incorporated by reference in their entireties.

TECHNICAL FIELD

The present invention relates to the communications field, and in particular, to a polar code processing method and communications device.

BACKGROUND

In a communications system, channel coding is usually used to improve reliability of data transmission and ensure communication quality. Polar (Polar) code is an encoding manner that can achieve a Shannon capacity and has low encoding/decoding complexity. A polar code is a linear block code. For the polar code, a generator matrix is $G_N$, and an encoding process is $x_1^N = u_1^N G_N$, where $u_1^N = (u_1, u_2, K, u_N)$ is a binary row vector, $G_N = B_N F_2^{\otimes (\log_2(N))}$, a code length is $N = 2^n$, and $n \geq 0$.

$$F_2 = \begin{bmatrix} 1 & 0 \\ 1 & 1 \end{bmatrix}.$$

$B_N$ is an N×N transposed matrix, for example, a bit reversal matrix. $F_2^{\otimes (\log_2(N))}$ is a Kronecker power (Kronecker power) of $F_2$ and is defined as $F^{\otimes (\log_2(N))} = F \otimes F^{\otimes ((\log_2(N))-1)}$.

In the encoding process of the polar code, some bits in $u_1^N$ are used to carry information, and are referred to as information bits. A sequence number set of these information bits is denoted by A. The rest of the bits are set to fixed values pre-agreed on by a transmitter side and a receiver side, and are referred to as frozen bits. A sequence number set of the frozen bits is denoted by $A^c$, a complementary set of A. Generally, these frozen bits are set to 0. In practical, the frozen bits may be set randomly, as long as a pre-agreement is made between the transmitter side and the receiver side. Therefore, a coded bit sequence of the polar code may be obtained by using the following method: $x_1^N = u_A G_N (A)$. Herein, $u_A$ is an information bit set in $u_1^N$, and $u_A$ is a row vector with a length K, that is, $|A| = K$, where $|\cdot|$ represents a quantity of elements in a set. In other words, K represents not only a quantity of elements in the set A, but also a quantity of to-be-encoded information bits. $G_N (A)$ is a sub-matrix consisting of rows in the matrix $G_N$ that are corresponding to indexes in the set A, and $G_N (A)$ is a K×N matrix. How the set A is selected determines performance of the polar code.

In an existing communications system, a transmitter side determines a code length and a code rate for channel coding, based on channel state information fed back by a receiver side in combination with a length of a to-be-sent message sequence, an available physical channel resource, and other information. An encoder at the transmitter side encodes a to-be-transmitted message sequence based on the code length and the code rate. Because different code lengths and code rates are corresponding to different codebooks, the encoder needs to store information about all codebooks. Likewise, to decode a received channel, a decoder also needs to store all the codebooks.

A codebook for a polar code depends on a code length M of a mother code and an information bit sequence number set A. In an existing polar code solution, neither an information bit sequence number set nor a bit selection order that is used for rate adaptation can be obtained through calculation by using a simple method. Therefore, for every possible code length and code rate, a polar code encoder and a polar code decoder need to store a corresponding information bit sequence number set and a rate adaptation table. These information bit sequence number sets and rate adaptation tables mean that a polar code is pre-constructed through density approximation in an offline manner by selecting a set of parameters according to a specific rule, depending on an actual system requirement and a working signal-to-noise ratio interval.

To support all code length and code rate combinations required by a system, a huge quantity of lookup tables need to be stored for encoding/decoding and rate adaptation of polar codes. Such storage overheads are intolerable for hardware system implementation.

Therefore, how to effectively encode/decode a polar code needs to be resolved urgently.

SUMMARY

Embodiments of the present invention provide a polar code processing method and communications device. According to the method, polar code encoding/decoding can be performed efficiently.

According to a first aspect, a polar code processing method is provided, where the method includes:

obtaining, based on a target coded bit quantity M and preset first mapping relationship information, a first sequence number set of M uncoded bits that is corresponding to the target coded bit quantity M, where the first mapping relationship information is used to indicate a one-to-one correspondence between a plurality of coded bit quantities and a plurality of uncoded bit sequence number sets, the M uncoded bits include K information bits, M target coded bits are obtained after polar encoding is performed on the M uncoded bits, and N bits in the M coded bits are transmitted on an actual channel, where M≥K, $M=2^n$, and n, N, and K are positive integers; and selecting, from the first sequence number set of the M uncoded bits according to a preset first selection rule, K sequence numbers as a sequence number set of the K information bits, where the K sequence numbers are used to represent positions of the K information bits in the M uncoded bits.

For example, to support all code lengths and code rates specified in LTE, because a length of a mother code of a polar code is limited to a power of 2, for example, when a value range of a code length of the mother code is from 132 to 18444, the code length of the mother code only needs to have eight values: 128, 256, 512, 1024, 2048, 4096, 8192, and 16384. Therefore, in this embodiment of the present invention, only eight correspondences, for example, entries, need to be stored. Compared with the prior art according to which 3000 entries are stored, this can greatly reduce storage overheads, and improve encoding/decoding efficiency of a polar code.

It should be understood that, in this embodiment of the present invention, an uncoded bit sequence number may be corresponding to a polar-encoded channel. In other words, the uncoded bit sequence number may also be considered as a sequence number of a polarized channel. The K sequence numbers are used to represent the positions of the K information bits in the M uncoded bits. In other words, the K sequence numbers are used to represent sequence numbers of K polarized channels that carry the K information bits.

It should be understood that the preset first mapping relationship information in this embodiment of the present invention is information pre-obtained by a transmitter side such as an encoder side and a receiver side such as a decoder side. The transmitter side and the receiver side perform encoding and decoding respectively by using the preset first mapping relationship information.

It should also be understood that the preset first mapping relationship information in this embodiment of the present invention may have a plurality of representation forms, provided that the one-to-one correspondence between the plurality of coded bit quantities and the plurality of uncoded bit sequence number sets can be indicated, and that a sequence number quantity of each uncoded bit sequence number set is equal to a coded bit quantity corresponding to the uncoded bit sequence number set. This is not limited in this embodiment of the present invention. For example, the preset first mapping relationship information may be a string of numeric values, or may be in a tabular form or the like.

With reference to the first aspect, in an implementation of the first aspect, a sequence number quantity of each of the plurality of uncoded bit sequence number sets is equal to a coded bit quantity corresponding to the uncoded bit sequence number set.

With reference to the first aspect, in an implementation of the first aspect, the selecting, from the first sequence number set of the M uncoded bits according to a preset first selection rule, K sequence numbers as a sequence number set of the K information bits includes:

selecting, from the first sequence number set of the M uncoded bits in a normal order or a reverse order, K sequence numbers as the sequence number set of the K information bits of the to-be-encoded data.

It should be understood that the preset first selection rule is a rule pre-agreed on by a transmitter side and a receiver side, that is, a rule known to both the transmitter side and the receiver side in advance. The transmitter side and the receiver side perform encoding or decoding by using the rule. Preferably, the first selection rule in this embodiment of the present invention may be used directly without a need of resetting or re-agreement. For example, the first selection rule in this embodiment of the present invention is a rule that is preset before polar encoding/decoding. The rule can be used for the transmitter side or the receiver side to select, from a sequence number set of M information bits, K sequence numbers as the sequence number set of the K information bits of the to-be-encoded data.

With reference to the first aspect or the foregoing implementation of the first aspect, in another implementation of the first aspect, after the selecting, from the first sequence number set of the M uncoded bits according to a preset first selection rule, K sequence numbers as a sequence number set of the K information bits, the method further includes:

obtaining, based on the target coded bit quantity M and preset second mapping relationship information, a second coded bit sequence number set that is corresponding to the target coded bit quantity M and whose quantity is $M_0$, where the second mapping relationship information is used to indicate a one-to-one correspondence between a plurality of coded bit quantities and a plurality of coded bit sequence number sets, and a sequence number quantity of each coded bit sequence number set is greater than or equal to a coded bit quantity corresponding to the coded bit sequence number set, where $M_0 \geq M$, and $M_0$ is a positive integer; and selecting, from the second coded bit sequence number set according to a preset second selection rule, N sequence numbers as sequence numbers of the N transmission bits, where the sequence numbers of the N transmission bits are used to represent positions of the N transmission bits in the M coded bits.

Therefore, according to this embodiment of the present invention, the second coded bit sequence number set that is corresponding to the target coded bit quantity M and whose quantity is $M_0$ is obtained based on the target coded bit quantity M and the preset second mapping relationship information, and the N sequence numbers are selected from the second coded bit sequence number set according to the preset second selection rule as the sequence numbers of the N transmission bits. Because $M=2^n$, the preset second mapping relationship information may include only a coded bit sequence number set corresponding to a coded bit length $2^n$. Therefore, pre-storage space is greatly saved, and encoding/decoding efficiency of a polar code is improved.

For example, to support all code lengths and code rates specified in LTE, because a length of a mother code of a polar code is limited to a power of 2, for example, when a value range of a code length of the mother code is from 132 to 18444, the code length of the mother code only needs to have eight values: 128, 256, 512, 1024, 2048, 4096, 8192, and 16384. Therefore, in this embodiment of the present invention, only eight correspondences, for example, entries, need to be stored. Compared with the prior art according to which 3000 entries are stored, this can greatly reduce storage overheads, and improve encoding/decoding efficiency of a polar code.

It should be understood that the preset second mapping relationship information in this embodiment of the present invention is information pre-obtained by a transmitter side such as an encoder side and a receiver side such as a decoder side. The transmitter side and the receiver side perform encoding and decoding respectively by using the preset second mapping relationship information.

It should be understood that the preset second mapping relationship information in this embodiment of the present invention may have a plurality of representation forms, provided that the one-to-one correspondence between the plurality of coded bit quantities and the plurality of coded bit sequence number sets can be indicated, and that the sequence number quantity of each coded bit sequence number set is greater than or equal to the coded bit quantity corresponding to the coded bit sequence number set. This is not limited in this embodiment of the present invention. For example, the preset second mapping relationship information may be a string of numeric values, or may be in a tabular form or the like.

It should be understood that the preset second selection rule is a rule pre-agreed on by a transmitter side and a receiver side, that is, a rule known to both the transmitter side and the receiver side in advance. The transmitter side and the receiver side perform encoding or decoding by using the rule. Preferably, the second selection rule in this embodiment of the present invention may be used directly without a need of resetting or re-agreement. For example, the second selection rule in this embodiment of the present invention is a rule that is preset before polar code encoding/decoding.

The rule can be used for the transmitter side or the receiver side to select, from the set of $M_0$ coded bit sequence numbers, N sequence numbers as the sequence numbers of the transmission bits.

With reference to the first aspect or the foregoing implementation of the first aspect, in another implementation of the first aspect, when $M_0=M$, the second coded bit sequence number set includes sequence numbers that are of the M coded bits and that are arranged in a normal order, a reverse order, or a bit-reverse order; or when $M_0>M$, the second coded bit sequence number set includes all or some of sequence numbers of the M coded bits, where the second coded bit sequence number set has at least $(M_0-M)$ duplicate sequence numbers.

With reference to the first aspect or the foregoing implementation of the first aspect, in another implementation of the first aspect, the selecting, from the second coded bit sequence number set according to a preset second selection rule, N sequence numbers as sequence numbers of the N transmission bits includes:

when $N \leq M_0$, selecting, from the second coded bit sequence number set in a normal order or a reverse order, the first N sequence numbers as the sequence numbers of the transmission bits; or when $N>M_0$, using, as the sequence numbers of the transmission bits, all sequence numbers that are selected from the second coded bit sequence number set in a normal order or a reverse order for a plurality of times and whose total quantity is N.

With reference to the first aspect or the foregoing implementation of the first aspect, in another implementation of the first aspect, the method further includes:

determining, based on the first sequence number set of the M uncoded bits, a third coded bit sequence number set that is of the M coded bits and whose sequence number quantity is M; and selecting, from the third coded bit sequence number set according to a preset third selection rule, N sequence numbers as sequence numbers of the N transmission bits, where the sequence numbers of the N transmission bits are used to represent positions of the N transmission bits in the M coded bits.

It should be noted that in this embodiment of the present invention, when $M_0=M$, the preset first mapping relationship information and the preset second mapping relationship information may be combined into one piece of mapping relationship information. It should be noted that when there is only one piece of mapping relationship information, the mapping relationship information may be used to indicate the one-to-one correspondence between the plurality of coded bit quantities and the plurality of uncoded bit sequence number sets, and the sequence number quantity of each uncoded bit sequence number set is equal to the coded bit quantity corresponding to the uncoded bit sequence number set; and the mapping relationship information may also be described as being used to indicate the one-to-one correspondence between the plurality of coded bit quantities and the plurality of coded bit sequence number sets, and the sequence number quantity of each coded bit sequence number set is equal to the coded bit quantity corresponding to the coded bit sequence number set.

It should be understood that the preset third selection rule is a rule pre-agreed on by a transmitter side and a receiver side, that is, a rule known to both the transmitter side and the receiver side in advance. The transmitter side and the receiver side perform encoding or decoding by using the rule. Preferably, the third selection rule in this embodiment of the present invention may be used directly without a need of resetting or re-agreement. For example, the third selection rule in this embodiment of the present invention is a rule that is preset before polar code encoding/decoding. The rule can be used for the transmitter side or the receiver side to select, from the sequence number set of the M coded bits, N sequence numbers as the sequence numbers of the transmission bits.

With reference to the first aspect or the foregoing implementation of the first aspect, in another implementation of the first aspect, the determining, based on the first sequence number set of the M uncoded bits, a third coded bit sequence number set includes:

arranging bit sequence numbers in the first sequence number set of the M uncoded bits in a normal order, a reverse order, or a bit-reverse order, to generate the third coded bit sequence number set.

It should be noted that when the third coded bit sequence number set is generated by arranging the bit sequence numbers in the first sequence number set of the M uncoded bits in a normal order, the third coded bit sequence number set is the same as the first sequence number set.

With reference to the first aspect or the foregoing implementation of the first aspect, in another implementation of the first aspect, the selecting, from the third coded bit sequence number set according to a preset third selection rule, N sequence numbers as sequence numbers of the N transmission bits includes:

when $N \leq M$, selecting, from the third coded bit sequence number set in a normal order or a reverse order, the first N sequence numbers as the sequence numbers of the transmission bits; or when $N>M$, using, as the sequence numbers of the transmission bits, all sequence numbers that are selected from the coded bit sequence number set in a normal order or a reverse order for a plurality of times and whose total quantity is N.

According to a second aspect, a polar code processing method is provided, where the method includes:

obtaining, based on a coded bit quantity M and preset second mapping relationship information, a second coded bit sequence number set that is corresponding to the coded bit quantity M and whose quantity is $M_0$, where the second mapping relationship information is used to indicate a one-to-one correspondence between a plurality of coded bit quantities and a plurality of coded bit sequence number sets, a sequence number quantity of each coded bit sequence number set is greater than or equal to a coded bit quantity corresponding to the coded bit sequence number set, M target coded bits are obtained after polar encoding is performed on M uncoded bits, the M uncoded bits include K information bits, and N bits in the M coded bits are transmitted on an actual channel, where $M_0 \geq M$, $M \geq K$, $M=2^n$, and n, N, K, and $M_0$ are positive integers; and selecting, from the second coded bit sequence number set according to a preset second selection rule, N sequence numbers as sequence numbers of the N transmission bits, where the sequence numbers of the N transmission bits are used to represent positions of the N transmission bits in the M coded bits.

Therefore, according to this embodiment of the present invention, the second coded bit sequence number set that is corresponding to the target coded bit quantity M and whose quantity is $M_0$ is obtained based on the target coded bit quantity M and the preset second mapping relationship information, and the N sequence numbers are selected from the second coded bit sequence number set according to the preset second selection rule as the sequence numbers of the N transmission bits. Because $M=2^n$, the preset second mapping relationship information may include only a coded bit sequence number set corresponding to a coded bit length $2^n$. Therefore, pre-storage space is greatly saved, and encoding/decoding efficiency of a polar code is improved.

For example, to support all code lengths and code rates specified in LTE, because a length of a mother code of a polar code is limited to a power of 2, for example, when a value range of a code length of the mother code is from 132 to 18444, the code length of the mother code only needs to have eight values: 128, 256, 512, 1024, 2048, 4096, 8192, and 16384. Therefore, in this embodiment of the present invention, only eight correspondences, for example, entries, need to be stored. Compared with the prior art according to which 3000 entries are stored, this can greatly reduce storage overheads, and improve encoding/decoding efficiency of a polar code.

It should be understood that the preset second selection rule is a rule pre-agreed on by a transmitter side and a receiver side, that is, a rule known to both the transmitter side and the receiver side in advance. The transmitter side and the receiver side perform encoding or decoding by using the rule. Preferably, the second selection rule in this embodiment of the present invention may be used directly without a need of resetting or re-agreement. For example, the second selection rule in this embodiment of the present invention is a rule that is preset before polar code encoding/decoding. The rule can be used for the transmitter side or the receiver side to select, from the set of $M_0$ coded bit sequence numbers, N sequence numbers as the sequence numbers of the transmission bits.

It should be understood that the preset second mapping relationship information in this embodiment of the present invention is information pre-obtained by a transmitter side such as an encoder side and a receiver side such as a decoder side. The transmitter side and the receiver side perform encoding and decoding respectively by using the preset first mapping relationship information.

It should be understood that the preset second mapping relationship information in this embodiment of the present invention may have a plurality of representation forms, provided that the one-to-one correspondence between the plurality of coded bit quantities and the plurality of coded bit sequence number sets can be indicated, and that the sequence number quantity of each coded bit sequence number set is greater than or equal to the coded bit quantity corresponding to the coded bit sequence number set. This is not limited in this embodiment of the present invention. For example, the preset second mapping relationship information may be a string of numeric values, or may be in a tabular form or the like.

With reference to the second aspect, in an implementation of the second aspect, when $M_0=M$, the second coded bit sequence number set includes sequence numbers that are of the M coded bits and that are arranged in a normal order, a reverse order, or a bit-reverse order; or when $M_0>M$, the second coded bit sequence number set includes all or some of sequence numbers of the M coded bits, where the second coded bit sequence number set has at least $(M_0-M)$ duplicate sequence numbers.

With reference to second first aspect or the foregoing implementation of the second aspect, in another implementation of the second aspect, the selecting, from the second coded bit sequence number set according to a preset second selection rule, N sequence numbers as sequence numbers of the N transmission bits includes:

when $N \leq M_0$, selecting, from the second coded bit sequence number set in a normal order or a reverse order, the first N sequence numbers as the sequence numbers of the transmission bits; or when $N > M_0$, using, as the sequence numbers of the transmission bits, all sequence numbers that are selected from the second coded bit sequence number set in a normal order or a reverse order for a plurality of times and whose total quantity is N.

According to a third aspect, a polar code processing communications device is provided. The communications device can implement any one of the first aspect and the implementations of the first aspect. Operations and/or functions of all modules in the communications device are used to implement corresponding method features in any one of the first aspect and the implementations of the first aspect. For brevity, details are not further described herein.

It should be noted that, the preset second mapping relationship information and the methods for, for example, the obtaining, based on a coded bit quantity M and preset second mapping relationship information, a second coded bit sequence number set that is corresponding to the coded bit quantity M and whose quantity is $M_0$ and the selecting N sequence numbers from the second coded bit sequence number set according to a preset second selection rule as sequence numbers of the N transmission bits in the second aspect are corresponding to the preset second mapping relationship information and the method embodiment for determining the sequence numbers of the transmission bits that are described in the first aspect. To avoid repetition, details are not further described herein.

According to a fourth aspect, a polar code processing communications device is provided. The communications device can implement any one of the second aspect and the implementations of the second aspect. Operations and/or functions of all modules in the communications device are used to implement corresponding method features in any one of the second aspect and the implementations of the second aspect. For brevity, details are not further described herein.

According to a fifth aspect, a polar code processing communications device is provided. The communications device includes an instruction storing memory and a processor. The processor executes the instruction to perform the polar code processing method according to any one of the first aspect and the implementations of the first aspect, or any one of the second aspect and the implementations of the second aspect.

According to a sixth aspect, a processing apparatus is provided. The processing apparatus is applied to a communications system. The processing apparatus may be one or more processors or chips. In another possible case, the processing apparatus may alternatively be a physical apparatus or a virtual apparatus in the communications system. The processing apparatus is configured to perform the polar code processing method according to any one of the first aspect and the implementations of the first aspect, or any one of the second aspect and the implementations of the second aspect.

According to a seventh aspect, a computer program product is provided. The computer program product includes computer program code, and when run by a computing unit, a processing unit, or a processor in the communications device, the computer program code enables the communications device to perform the polar code processing method according to any one of the first aspect and the implementations of the first aspect, or any one of the second aspect and the implementations of the second aspect.

According to an eighth aspect, a computer readable storage medium is provided. The computer readable storage medium stores a program, and the program enables a communications device to perform the polar code processing method according to any one of the first aspect and the implementations of the first aspect, or any one of the second aspect and the implementation of the second aspect.

According to a ninth aspect, a program is provided, which enables communications device to perform the polar code processing method according to any one of the first aspect and the implementations of the first aspect, or any one of the second aspect and the implementations of the second aspect.

Based on the foregoing technical solutions, according to the embodiments of the present invention, the first sequence number set of the M uncoded bits that is corresponding to the target coded bit quantity M is obtained based on the target coded bit quantity M and the preset first mapping relationship information, and the K sequence numbers are selected from the first sequence number set of the M uncoded bits according to the preset first selection rule as the sequence number set of the K information bits. Because $M=2^n$, the preset first mapping relationship information may include only a coded bit sequence number set corresponding to a coded bit length $2^n$. Therefore, pre-storage space is greatly saved, and encoding/decoding efficiency of a polar code is improved.

BRIEF DESCRIPTION OF DRAWINGS

FIG. 4 is a schematic flowchart of a polar code processing method according to an embodiment of the present invention;

FIG. 5 is a schematic flowchart of a polar code processing method according to another embodiment of the present invention;

DESCRIPTION OF EMBODIMENTS

The following clearly describes the technical solutions in the embodiments of the present invention with reference to the accompanying drawings in the embodiments of the present invention.

The embodiments of the present invention may be applied to various communications systems. Therefore, the following description is not limited to a specific communications system, for example, a Global System for Mobile Communications (GSM) system, a Code Division Multiple Access (CDMA) system, a Wideband Code Division Multiple Access (WCDMA) system, a general packet radio service (GPRS), a Long Term Evolution (LTE) system, an LTE frequency division duplex (FDD) system, an LTE time division duplex (TDD) system, or a Universal Mobile Telecommunications System (UMTS). All information or data on which encoding processing is performed by a base station or a terminal in the foregoing system by using a conventional turbo code and LDPC code can be encoded by using a polar code in the embodiments.

The base station may be a device configured to communicate with a terminal device. For example, the base station may be a base transceiver station (BTS) in a GSM system or CDMA, may be a NodeB (NodeB, NB) in a WCDMA system, or may be an evolved NodeB (Evolved NodeB, eNB or eNodeB) in an LTE system. Alternatively, the base station may be a relay station, an access point, an in-vehicle device, a wearable device, a network-side device in a future 5G network, or the like.

The terminal device may communicate with one or more core networks by using a radio access network (RAN). The terminal may be user equipment (UE), an access terminal, a subscriber unit, a subscriber station, a mobile station, a remote station, a remote terminal, a mobile device, a user terminal, a wireless communications device, a user agent, or a user apparatus. The access terminal may be a cellular phone, a cordless phone, a Session Initiation Protocol (SIP) phone, a wireless local loop (WLL) station, a personal digital assistant (PDA), a handheld device or a computing device having a wireless communication function, another processing device, an in-vehicle device, or a wearable device connected to a wireless modem, a terminal device in a future 5G network, or the like.

Figure 1:
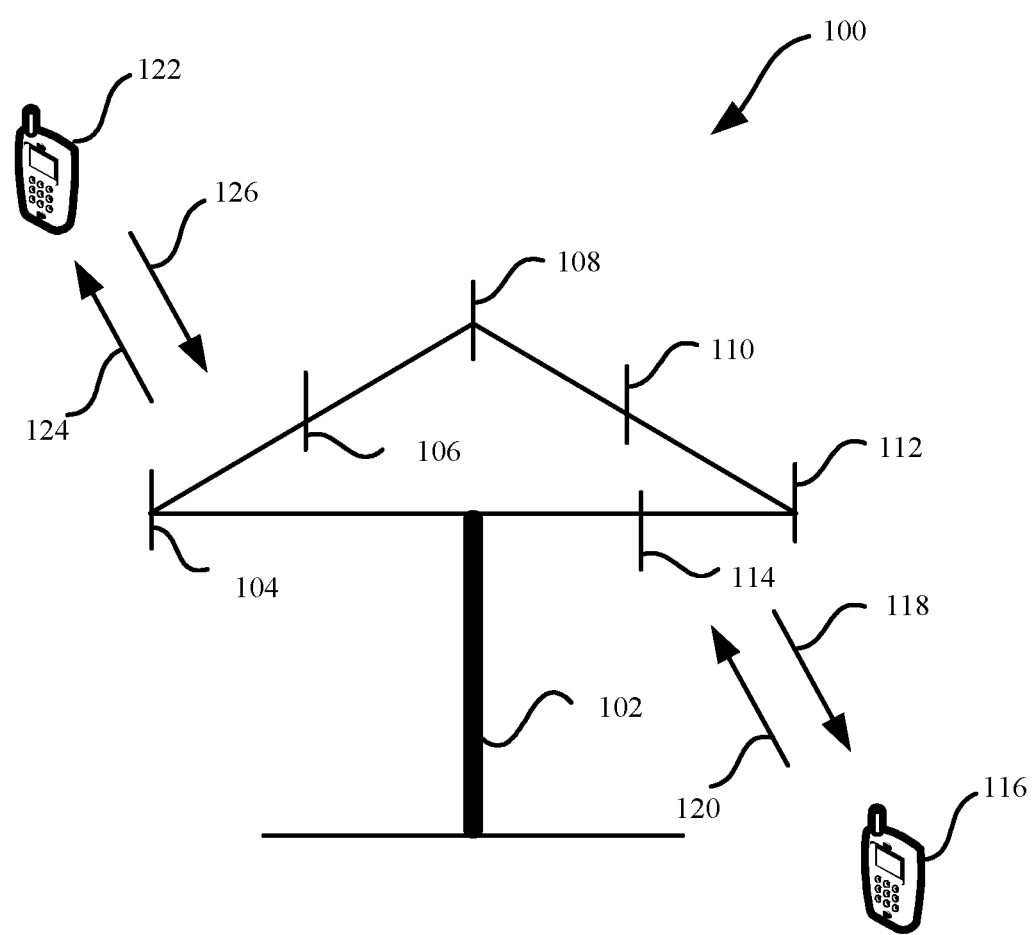
FIG. 1 is a schematic diagram of a wireless communications system according to an embodiment of the present invention.

FIG. 1 shows a wireless communications system 100 according to the embodiments described in this specification. The system 100 includes a base station 102, and the base station 102 may include a plurality of antenna groups. For example, one antenna group may include antennas 104 and 106, another antenna group may include antennas 108 and 110, and an additional group may include antennas 112 and 114. Two antennas are shown for each antenna group. However, more or less antennas may be used for each group. The base station 102 may additionally include a transmitter chain and a receiver chain. A person of ordinary skill in the art understands that both the transmitter chain and the receiver chain can include a plurality of components related to signal sending and receiving, for example, a processor, a modulator, a multiplexer, a demodulator, a demultiplexer, and an antenna.

The base station 102 can communicate with one or more access terminals, for example, an access terminal 116 and an access terminal 122. However, it is understood that the base station 102 can communicate with, basically, any quantity of access terminals similar to the access terminals 116 and 122. The access terminals 116 and 122 can be, for example, a cellular phone, a smartphone, a portable computer, a handheld communications device, a handheld computing device, a satellite radio apparatus, a global positioning system, a PDA, and/or any other suitable device configured to perform communication in the wireless communications system 100. As shown in the figure, the access terminal 116 communicates with the antennas 112 and 114. The antennas 112 and 114 send information to the access terminal 116 through a forward link 118, and receive information from the access terminal 116 through a reverse link 120. In addition, the access terminal 122 communicates with the antennas 104 and 106. The antennas 104 and 106 send information to the access terminal 122 through a forward link 124, and receive information from the access terminal 122 through a reverse link 126. In a frequency division duplex (FDD) system, for example, the forward link 118 can use a frequency band different from that used by the reverse link 120, and the forward link 124 can use a frequency band different from that used by the reverse link 126. In addition, in a time division duplex (TDD) system, a same frequency band can be used for the forward link 118 and the reverse link 120, and a same frequency band can be used for the forward link 124 and the reverse link 126.

Each antenna group and/or area designed for communication is referred to as a sector of the base station 102. For example, an antenna group can be designed to communicate with an access terminal in a sector in a coverage area of the base station 102. During communication through the forward links 118 and 124, a transmit antenna of the base station 102 may improve signal-to-noise ratios of the forward links 118 and 124 for the access terminals 116 and 122 through beamforming. In addition, compared with sending, by a base station, information to all access terminals of the base station by using a single antenna, sending, by the base station 102 through beamforming, information to the access terminals 116 and 122 that are distributed randomly in the coverage area causes less interference to a mobile device in a neighbor cell.

In a given time, the base station 102, the access terminal 116, and/or the access terminal 122 may be a sending wireless communications apparatus and/or a receiving wireless communications apparatus. When sending data, the sending wireless communications apparatus can encode the data for transmission. The sending wireless communications apparatus can, for example, generate, obtain, or store in a memory, a particular quantity of information bits to be sent to the receiving wireless communications apparatus through a channel. The information bits can be included in one or more transport blocks of data, and the transport block can be segmented to produce a plurality of code blocks. In addition, the sending wireless communications apparatus can encode each code block by using a polar code encoder, to improve reliability of data transmission and further ensure communication quality.

Figure 2:
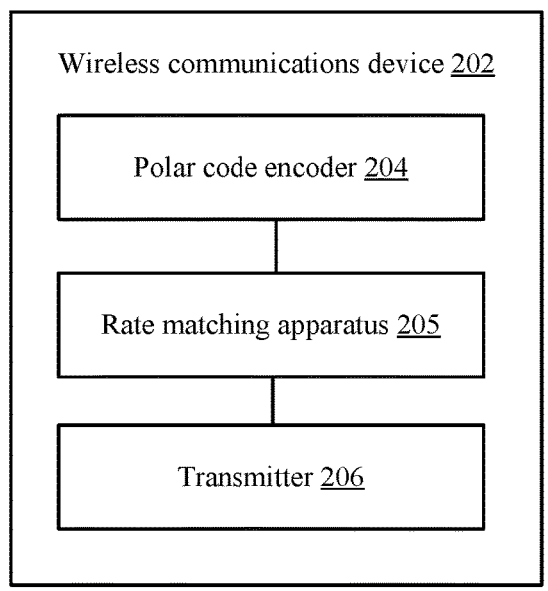
FIG. 2 is a schematic block diagram of a communications device according to an embodiment of the present invention.

FIG. 2 is a schematic block diagram of a system 200 to which a polar code processing method of the present invention is applicable, in a wireless communications environment. The system 200 includes a wireless communications device 202, and the wireless communications device 202 is displayed as sending data through a channel. Although shown as sending data, the wireless communications device 202 may also receive data through a channel. For example, the wireless communications device 202 can simultaneously send and receive data, the wireless communications device 202 can send and receive data at different times, or a combination thereof can be implemented. The wireless communications device 202 may be, for example, a base station such as the base station 102 in FIG. 1, or an access terminal such as the access terminal 116 in FIG. 1 or the access terminal 122 in FIG. 1.

The wireless communications device 202 may include a polar code encoder 204, a rate matching apparatus 205, and a transmitter 206. Optionally, when the wireless communications device 202 receives data through a channel, the wireless communications device 202 may further include a receiver. The receiver may exist independently, or may be integrated with the transmitter 206 to form a transceiver.

The polar code encoder 204 is configured to encode data that needs to be transferred from the wireless communications apparatus 202. This is specifically packet encoding. This process is described in detail later, to obtain a target packet codeword.

The rate matching apparatus 205 is configured to perform interleaving, rate matching, and the like on the target packet codeword, to generate interleaved output bits.

In addition, the transmitter 206 may subsequently transfer, on a channel, the rate-matched output bits that are processed by the rate matching apparatus 205. For example, the transmitter 206 may send the data to another different wireless communications apparatus that is not shown in the figure.

Figure 3:
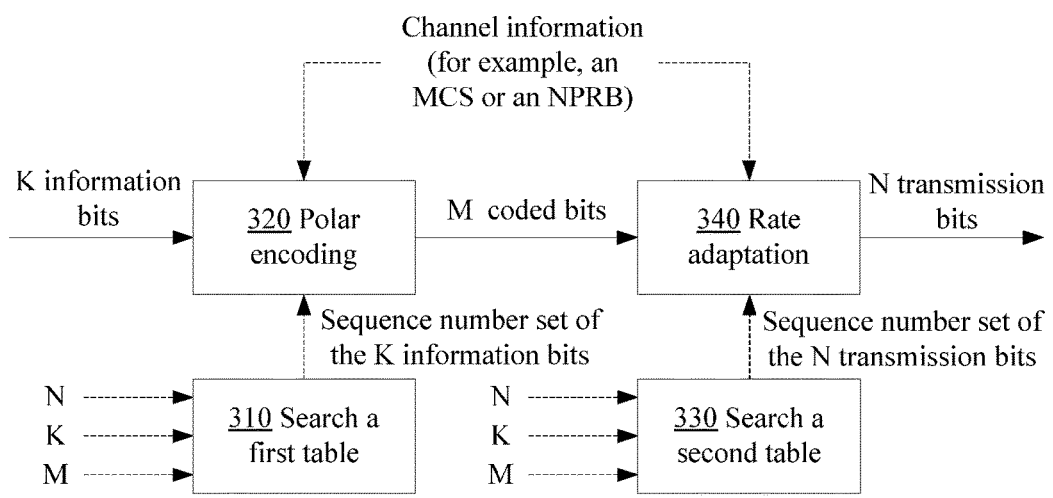
FIG. 3 is a schematic block diagram of a polar code processing method.

FIG. 3 is a schematic block diagram of a polar code processing method.

As shown in FIG. 3, when polar encoding is performed, a first step is to determine, by searching a first table 310, which K bits are to be selected as information bits. In this way, a set A consisting of sequence numbers of the K information bits is determined. Input parameters for searching the first table are an uncoded bit quantity M or a polarized channel quantity, a transmission bit quantity N or an actual physical channel quantity, and an information bit quantity K; and an output parameter of searching the first table is a sequence number set of K information bits. In other words, in the first table, a combination of any numeric values of K, M, and N has a corresponding entry of a sequence number set of K information bits. Specific values of K, M, and N may be determined based on channel information. The channel information may include a modulation and coding scheme (MCS), a number of physical resource blocks (NPRB), and the like.

A second step is to perform polar encoding 320 on the K information bits. Positions of the K information bits are determined in the M uncoded bits based on the sequence number set of K information bits that is determined in first step. The other (M−K) bits in the M uncoded bits are frozen bits. Polar encoding 320 is performed on the M uncoded bits to obtain M coded bits. To be specific, the M uncoded bits include the K information bits and the (M−K) frozen bits. In other words, an input parameter for the polar encoding is the M uncoded bits, and an output parameter of the polar encoding is the M coded bits.

A third step is to perform, after polar encoding 320 is performed on the M uncoded bits to obtain the M coded bits, rate adaptation 340 to obtain a correspondence between N transmission bits and the M coded bits. In this case, a second table needs to be searched 330. Input parameters for searching the second table are the information bit quantity K, the transmission bit quantity N, and a coded bit quantity M; and an output parameter of searching the second table is a sequence number set of the N transmission bits. The second table is also the correspondence between the N transmission bits and the M coded bits. In other words, in the second table, a combination of any numeric values of K, M, and N has a corresponding entry of a sequence number set of N transmission bits.

A fourth step is to perform rate adaptation 340 on the M coded bits. The N transmission bits are determined from the M coded bits based on the sequence number set of the N transmission bits that is obtained in third step. In other words, N bits that are in the M coded bits and that are corresponding to the sequence number set of the N transmission bits are used as transmission bits. An input parameter for the rate adaptation is the M coded bits, and an output parameter of the rate adaptation is the N transmission bits.

Code block lengths specified in an LTE protocol and possible lengths resulting from rate adaptation are used as an example, where the code block length is a quantity of information bits input into an encoder. An information bit quantity K has a total of 188 possible values, with a value range from 40 to 6144, and a value range of a code length of a mother code is from 132 to 18444; and there are about 3000 possible code lengths resulting from rate adaptation. If this solution is used, to support the same quantity of code length and code rate configurations, about 3000 lookup entries with a length up to about tens to hundreds of thousands need to be stored. These entries are correspondences. Therefore, storage overheads in this case are extremely great. As a result, polar encoding/decoding efficiency is relatively low.

In view of the foregoing problem, the polar code processing method disclosed in this embodiment of the present invention can improve encoding/decoding efficiency of a polar code.

It should be understood that the polar code processing method according to this embodiment of the present invention may be applied to both polar code encoding and polar code decoding. This is not limited in this embodiment of the present invention.

FIG. 4 is a schematic flowchart of a polar code processing method according to an embodiment of the present invention. The method 400 shown in FIG. 4 may be performed by a polar code processing communications device. The polar code processing communications device may be an encoding device, a decoding device, a transmitter side, or a receiver side. The communications device may be a base station or a terminal. This is not limited in this embodiment of the present invention.

The method 400 shown in FIG. 4 includes the following operations:

410. Obtain, based on a target coded bit quantity M and preset first mapping relationship information, a first sequence number set of M uncoded bits that is corresponding to the target coded bit quantity M, where the first mapping relationship information is used to indicate a one-to-one correspondence between a plurality of coded bit quantities and a plurality of uncoded bit sequence number sets, the M uncoded bits include K information bits, M target coded bits are obtained after polar encoding is performed on the M uncoded bits, and N bits in the M coded bits are transmitted on an actual channel, where M≥K, $M=2^n$, and n, N, and K are positive integers.

420. Select, from the first sequence number set of the M uncoded bits according to a preset first selection rule, K sequence numbers as a sequence number set of the K information bits, where the K sequence numbers are used to represent positions of the K information bits in the M uncoded bits.

Therefore, according to this embodiment of the present invention, the first sequence number set of the M uncoded bits that is corresponding to the target coded bit quantity M is obtained based on the target coded bit quantity M and the preset first mapping relationship information, and the K sequence numbers are selected from the first sequence number set of the M uncoded bits according to the preset first selection rule as the sequence number set of the K information bits. Because $M=2^n$, the preset first mapping relationship information may include only a coded bit sequence number set corresponding to a coded bit length $2^n$. Therefore, pre-storage space is greatly saved, and encoding/decoding efficiency of a polar code is improved.

For example, to support all code lengths and code rates specified in LTE, because a length of a mother code of a polar code is limited to a power of 2, for example, when a value range of a code length of the mother code is from 132 to 18444, the code length of the mother code only needs to have eight values: 128, 256, 512, 1024, 2048, 4096, 8192, and 16384. Therefore, in this embodiment of the present invention, only eight correspondences need to be stored, where the correspondences may be entries. Compared with the prior art according to which 3000 entries are stored, this can greatly reduce storage overheads, and improve encoding/decoding efficiency of a polar code, and is therefore more suitable for actual system application.

In particular, when polar code encoding is performed, K sequence numbers may first be determined from M coded bit sequence numbers according to the method shown in FIG. 4 as the sequence number set of the K information bits. In this way, the positions of the K information bits in the M uncoded bits are determined. Then, the K information bits are placed in the determined positions during encoding, and the other (M−K) positions in the M uncoded bits are padded with frozen bits. Afterwards, subsequent polar encoding is performed to obtain the M coded bits.

Similarly, when polar code decoding is performed, the positions of the K information bits may be determined according to the method shown in FIG. 4. When the positions of the K information bits are determined, the other (M−K) positions are determined as frozen bits. Then, a decoder may perform polar decoding on bits carried in the K positions, and finally, K decoded bits are obtained.

It should be understood that in this embodiment of the present invention, the plurality of coded bit quantities are in one-to-one correspondence with the plurality of uncoded bit sequence number sets. In addition, a sequence number quantity of each of the plurality of uncoded bit sequence number sets is equal to a coded bit quantity corresponding to the uncoded bit sequence number set. For example, the first sequence number set corresponding to the coded bit quantity M includes M sequence numbers. In other words, a sequence number quantity of the first sequence number set is also M.

It should be understood that, in this embodiment of the present invention, an uncoded bit sequence number may be corresponding to a polar-encoded channel. In other words, the uncoded bit sequence number may also be considered as a sequence number of a polarized channel. The K sequence numbers are used to represent the positions of the K information bits in the M uncoded bits. In other words, the K sequence numbers are used to represent sequence numbers of K polarized channels that carry the K information bits.

It should be understood that the preset first mapping relationship information in this embodiment of the present invention is information pre-obtained by a transmitter side such as an encoder side and a receiver side such as a decoder side. The transmitter side and the receiver side perform encoding and decoding respectively by using the preset first mapping relationship information.

It should also be understood that the preset first mapping relationship information in this embodiment of the present invention may have a plurality of representation forms, provided that the one-to-one correspondence between the plurality of coded bit quantities and the plurality of uncoded bit sequence number sets can be indicated, and that the sequence number quantity of each uncoded bit sequence number set is equal to the coded bit quantity corresponding to the uncoded bit sequence number set. This is not limited in this embodiment of the present invention. For example, the preset first mapping relationship information may be a string of numeric values, or may be in a tabular form or the like. For example, when the preset first mapping relationship information is a table, the preset first mapping relationship information may be described in Table 1.

TABLE 1

| Coded bit quantity | Uncoded bit sequence number set | | | | | | |
|---|---|---|---|---|---|---|---|
| 128 | 1 | 2 | 3 | 4 | 5 | ... | 128 |
| 256 | 1 | 2 | 3 | 4 | 5 | ... | 256 |
| 512 | 1 | 2 | 3 | 4 | 5 | ... | 512 |
| ... | | | | | | | |
| 16384 | 1 | 2 | 3 | 4 | 5 | ... | 16384 |

It should be noted that a sequence number order of the sequence number set in Table 1 is merely illustrative. An arrangement order of sequence numbers in the uncoded bit sequence number set is not limited in this embodiment of the present invention. For example, in actual application, a sequence number having a greater numeric value is arranged nearer to the front of the uncoded bit sequence number set. Generally, a greater or heavier numeric value of an uncoded bit, or a polarized channel, indicates a more reliable channel. Therefore, the sequence numbers in Table 1 may be arranged in a reverse order. To be specific, a sequence number having a greater numeric value is arranged in a position nearer to the front of the uncoded bits. Subsequently, the K sequence numbers may be selected according to the first selection rule. For example, K sequence numbers in positions nearest to the front may be selected as the sequence numbers of the information bits.

For another example, when the preset first mapping relationship information is a string of numeric values, the preset first mapping relationship information may be numeric values corresponding to coded bit quantities arranged in ascending order. For example, the string of numeric values may be 128, 1, 2, 3, 4, 5, ..., 128; 256, 1, 2, 3, 4, 5, ..., 256; 512, 1, 2, 3, 4, 5, ..., 512; ...; 16384, 1, 2, 3, 4, 5, ..., 16384. For the first portion 128, 1, 2, 3, 4, 5, ..., 128 of the string of numeric values, the first 128 may be used to represent a coded bit quantity, and the following 1, 2, 3, 4, 5, ..., 128 may be used to represent an uncoded bit sequence number set. Meanings of the other portions of the string of numeric values are similar to that of the first portion, and are not further described herein.

It should be understood that in step 420, the preset first selection rule is a rule pre-agreed on by a transmitter side and a receiver side, that is, a rule known to both the transmitter side and the receiver side in advance. The transmitter side and the receiver side perform encoding or decoding by using the rule. In other words, the first selection rule in this embodiment of the present invention may be used directly without a need of resetting or re-agreement. For example, the first selection rule in this embodiment of the present invention is a rule that is preset before polar encoding/decoding. The rule can be used for the transmitter side or the receiver side to select, from a sequence number set of M information bits, K sequence numbers as the sequence number set of the K information bits of the to-be-encoded data.

For example, in step 420, K sequence numbers may be selected from the first sequence number set of the M uncoded bits in a normal order or a reverse order as the sequence number set of the K information bits of the to-be-encoded data.

For example, when M=128, and K=50, the first sequence number set of the M uncoded bits is $[m_1, m_2 \ldots m_{128}]$. In this way, K sequence numbers $[m_1, m_2 \ldots m_{50}]$ may be selected from the first sequence number set in a normal order as the sequence number set of the K information bits of the to-be-encoded data. For example, for Table 1, the selected K sequence numbers are [1, 2, ... 50]. Alternatively, K sequence numbers $[m_{128}, m_{127} \ldots m_{79}]$ may be selected from the first sequence number set in a reverse order as the sequence number set of the K information bits of the to-be-encoded data. For example, for Table 1, the selected K sequence numbers are [128, 127, ... 79].

It should be understood that in this embodiment of the present invention, the transmitter side may send the M coded bits to the receiver side directly after the M coded bits are obtained. In actual application, because a channel resource quantity may be greater than or less than M, N coded bits generated from the M coded bits are sent. In this case, rate adaptation needs to be performed to obtain N transmission bits and transmit the N transmission bits. N may be greater than, less than, or equal to M. This is not limited in this embodiment of the present invention.

When rate adaptation needs to be performed in this embodiment of the present invention, after step 420, the method according to this embodiment of the present invention may further includes:

obtaining, based on the target coded bit quantity M and preset second mapping relationship information, a second coded bit sequence number set that is corresponding to the target coded bit quantity M and whose quantity is $M_0$, where the second mapping relationship information is used to indicate a one-to-one correspondence between a plurality of coded bit quantities and a plurality of coded bit sequence number sets, and a sequence number quantity of each coded bit sequence number set is greater than or equal to a coded bit quantity corresponding to the coded bit sequence number set, where $M_0 \geq M$, and $M_0$ is a positive integer; and selecting, from the second coded bit sequence number set according to a preset second selection rule, N sequence numbers as sequence numbers of the N transmission bits, where the sequence numbers of the N transmission bits are used to represent positions of the N transmission bits in the M coded bits.

Therefore, according to this embodiment of the present invention, the second coded bit sequence number set that is corresponding to the target coded bit quantity M and whose quantity is $M_0$ is obtained based on the target coded bit quantity M and the preset second mapping relationship information, and the N sequence numbers are selected from the second coded bit sequence number set according to the preset second selection rule as the sequence numbers of the N transmission bits. Because $M=2^n$, the preset second mapping relationship information may include only a coded bit sequence number set corresponding to a coded bit length $2^n$. Therefore, pre-storage space is greatly saved, and encoding/decoding efficiency of a polar code is improved.

For example, to support all code lengths and code rates specified in LTE, because a length of a mother code of a polar code is limited to a power of 2, for example, when a value range of a code length of the mother code is from 132 to 18444, the code length of the mother code only needs to have eight values: 128, 256, 512, 1024, 2048, 4096, 8192, and 16384. Therefore, in this embodiment of the present invention, only eight correspondences, for example, only eight entries, need to be stored. Compared with the prior art according to which 3000 entries are stored, this can greatly reduce storage overheads, and improve encoding/decoding efficiency of a polar code.

It should be understood that the preset second mapping relationship information in this embodiment of the present invention is information pre-obtained by a transmitter side such as an encoder side and a receiver side such as a decoder side. The transmitter side and the receiver side perform encoding and decoding respectively by using the preset first mapping relationship information.

It should be understood that the preset second mapping relationship information in this embodiment of the present invention may have a plurality of representation forms, provided that the one-to-one correspondence between the plurality of coded bit quantities and the plurality of coded bit sequence number sets can be indicated, and that the sequence number quantity of each coded bit sequence number set is greater than or equal to the coded bit quantity corresponding to the coded bit sequence number set. This is not limited in this embodiment of the present invention. For example, the preset second mapping relationship information may be a string of numeric values, or may be in a tabular form or the like.

For example, when $M_0=M$, the second coded bit sequence number set includes sequence numbers that are of the M coded bits and that are arranged in a normal order, a reverse order, or a bit-reverse order; or when $M_0>M$, the second coded bit sequence number set includes all or some of sequence numbers of the M coded bits, where the second coded bit sequence number set has at least $(M_0-M)$ duplicate sequence numbers.

It should be understood that in this embodiment of the present invention, when $M_0=M$, and the second coded bit sequence number set consists of the sequence numbers of the M coded bits in a normal order, the second coded bits sequence number set is the same as a sequence number set of the M coded bits; or when $M_0>M$, the second coded bit sequence number set consists of all or some of the sequence numbers of the M coded bits, and the second coded bit sequence number set has at least the $(M_0-M)$ duplicate sequence numbers. Duplicate sequence numbers may be determined based on an actual situation, provided that $M_0$ second coded bit sequence numbers constructed in this embodiment of the present invention can reduce a bit error rate FER of the finally selected N transmission bits. This is not limited in this embodiment of the present invention.

For example, when the preset second mapping relationship information is a table, and when $M_0=M$, and the set of $M_0$ second coded bit sequence numbers consists of the sequence numbers of the M coded bits in a normal order, the preset second mapping relationship information may be described in Table 2.

TABLE 2

| Coded bit quantity | Coded bit sequence number set | | | | | | |
|---|---|---|---|---|---|---|---|
| 128 | 1 | 2 | 3 | 4 | 5 | ... | 128 |
| 256 | 1 | 2 | 3 | 4 | 5 | ... | 256 |
| 512 | 1 | 2 | 3 | 4 | 5 | ... | 512 |
| 16384 | 1 | 2 | 3 | 4 | 5 | ... | 16384 |

It should be noted that a sequence number order of the sequence number set in Table 2 is merely illustrative. An arrangement order of sequence numbers in the coded bit sequence number set is not limited in this embodiment of the present invention. For example, in actual application, a sequence number having a greater numeric value is arranged nearer to the front of the coded bit sequence number set. Generally, a greater or heavier numeric value of a coded bit, or a polarized channel, indicates a more reliable channel. Therefore, the sequence numbers in Table 2 may be arranged in a reverse order. In other words, a sequence number having a greater numeric value is arranged in a position nearer to the front of the coded bits. Subsequently, the N sequence numbers may be selected as the sequence numbers of the transmission bits according to the second selection rule.

For another example, when the preset second mapping relationship information is a string of numeric values, the preset second mapping relationship information may be numeric values corresponding to coded bit quantities arranged in ascending order. For example, the string of numeric values may be 128, 1, 2, 3, 4, 5, . . . , 128; 256, 1, 2, 3, 4, 5, . . . , 256; 512, 1, 2, 3, 4, 5, . . . , 512; . . . ; 16384, 1, 2, 3, 4, 5, . . . , 16384. For the first portion 128, 1, 2, 3, 4, 5, . . . , 128 of the string of numeric values, the first 128 may be used to represent a coded bit quantity, and the following 1, 2, 3, 4, 5, . . . , 128 may be used to represent a coded bit sequence number set. Meanings of the other portions of the string of numeric values are similar to that of the first portion, and are not further described herein.

For another example, when $M_0>M$, the set of $M_0$ second coded bit sequence numbers includes, sequentially, the sequence numbers that are of the M coded bits and that are arranged in a normal order and sequence numbers of $(M_0-M)$ coded bits that are in the M coded bits and that have better channel states. The preset second mapping relationship information may be described in Table 3.

TABLE 3

| Coded bit quantity | Coded bit sequence number set | | | | | | | |
|---|---|---|---|---|---|---|---|---|
| 128 | 1 | 2 | 3 | 4 | 5 | ... | 128 | 6 | 100 |
| 256 | 1 | 2 | 3 | 4 | 5 | ... | 256 | 50 | 200 |
| 512 | 1 | 2 | 3 | 4 | 5 | ... | 512 | 300 | 455 |
| 16384 | 1 | 2 | 3 | 4 | 5 | ... | 16384 | 10000 | 16000 |

It should be understood that numeric values in Table 3 are merely illustrative, and Table 3 only describes a situation with $M_0=M+2$. However, this embodiment of the present invention is not limited thereto. A difference between a coded bit sequence number quantity and a coded bit quantity may be any value, and differences corresponding to different coded bit quantities may also be different. This embodiment of the present invention is not limited thereto. As described in Table 3, when the coded bit data is 128, the second coded bit sequence number set includes sequence numbers 1 to 128 and sequence numbers 6 and 100. Similarly, when M is equal to 256 or another value, sequence numbers included in the second coded bit sequence number set are similar to the foregoing description, and are not further described herein.

For another example, when the preset second mapping relationship information is a string of numeric values, the preset second mapping relationship information may be numeric values corresponding to coded bit quantities arranged in ascending order. For example, the string of numeric values may be 128, 1, 2, 3, 4, 5, . . . , 128, 6, 100; 256, 1, 2, 3, 4, 5, . . . , 256, 50, 200; 512, 1, 2, 3, 4, 5, . . . , 512, 300, 455; . . . ; 16384, 1, 2, 3, 4, 5, . . . , 10000, 16000.

It should be understood that the preset second selection rule is a rule pre-agreed on by a transmitter side and a receiver side, that is, a rule known to both the transmitter side and the receiver side in advance. The transmitter side and the receiver side perform encoding or decoding by using the rule. Preferably, the second selection rule in this embodiment of the present invention may be used directly without a need of resetting or re-agreement. For example, the second selection rule in this embodiment of the present invention is a rule that is preset before polar code encoding/decoding. The rule can be used for the transmitter side or the receiver side to select, from the set of $M_0$ coded bit sequence numbers, N sequence numbers as the sequence numbers of the transmission bits.

For example, the selecting, from the second coded bit sequence number set according to a preset second selection rule, N sequence numbers as sequence numbers of the N transmission bits includes:

when $N \leq M_0$, selecting, from the second coded bit sequence number set in a normal order or a reverse order, the first N sequence numbers as the sequence numbers of the transmission bits; or when $N > M_0$, using, as the sequence numbers of the transmission bits, all sequence numbers that are selected from the second coded bit sequence number set in a normal order or a reverse order for a plurality of times and whose total quantity is N.

For example, when $M_0=130$, and $N=50$, the second coded bit sequence number set is $[m_1, m_2 \ldots m_{128}, m_{129}, m_{130}]$. In this case, N sequence numbers $[m_1, m_2 \ldots m_{50}]$ may be selected from the $M_0$ sequence numbers in the second coded bit sequence number set in a normal order as the sequence numbers of the transmission bits. For example, for Table 3, the selected N sequence numbers are $[1, 2, \ldots 50]$. Alternatively, N sequence numbers $[m_{130}, m_{129} \ldots m_{81}]$ may be selected from the $M_0$ sequence numbers in the second coded bit sequence number set in a reverse order as the sequence numbers of the transmission bits. For example, for Table 3, the selected N sequence numbers are $[100, 6, 128, \ldots 81]$.

Optionally, in another embodiment, before step 410, the method according to this embodiment of the present invention may further include determining the coded bit quantity M.

The determining the coded bit quantity M can include:

determining a matching entry that is in a first lookup table and that matches current channel state information, a quantity of bits included in a to-be-sent message sequence, and a maximum quantity of bits currently allowed to be transmitted, where an entry in the first lookup table includes channel state information, a quantity of bits included in a message sequence, a maximum quantity of bits allowed to be transmitted, and a coded bit quantity; and determining a coded bit quantity that is in the matching entry and that is corresponding to the current channel state information, the quantity of bits included in the to-be-sent message sequence, and the maximum quantity of bits currently allowed to be transmitted, as the coded bit quantity M.

For example, the first lookup table may be of a form described in the following Table 4.

TABLE 4

| Channel state information | Quantity of bits included in a message sequence | Maximum quantity of bits allowed to be transmitted | Coded bit quantity |
|---|---|---|---|
| 0 | 128 | 768 | 1024 |
| 0 | 136 | 768 | 1024 |
| ... | ... | ... | ... |
| 7 | 16384 | 32768 | 4096 |
| ... | ... | ... | ... |

It should be understood that numeric values in Table 4 are merely illustrative, and the present invention is not limited thereto.

Alternatively, the determining the coded bit quantity M includes determining a matching entry that is in a second lookup table and that matches the information bit quantity K and the transmission bit quantity N, where an entry in the second lookup table includes an information bit quantity, a transmission bit quantity, and a coded bit quantity; and determining a coded bit quantity that is in the entry and that is corresponding to the information bit quantity K of the to-be-encoded code block and the transmission bit quantity N, as the coded bit quantity M.

For example, the second lookup table may be of a form described in the following Table 5.

TABLE 5

| Information bit quantity | Transmission bit quantity | Coded bit quantity |
|---|---|---|
| 144 | 768 | 1024 |
| 152 | 768 | 1024 |
| ... | ... | ... |
| 2066 | 4096 | 4096 |
| ... | ... | ... |

It should be understood that numeric values in Table 5 are merely illustrative, and the present invention is not limited thereto.

Alternatively, the determining the coded bit quantity M includes determining, by using the following formula based on a maximum transmission code rate $R_{max}$, a maximum allowed code length $M_{max}$, and a minimum allowed code length $M_{min}$, the coded bit quantity M obtained after the to-be-encoded code block is encoded:

$$M = \min\left\{M_{max}, \max\left(M_{min}, 2^{\lceil log_2 N \rceil}, 2^{\lceil log_2 \frac{K}{R_{max}} \rceil}\right)\right\},$$

where $R_{max}$, $M_{max}$, and $M_{min}$ are positive integers.

Optionally, in an embodiment of the present invention, this embodiment of the present invention may further include determining the information bit quantity K of the to-be-encoded code block and the quantity N of transmission bits of the to-be-encoded code block that are transmitted on an actual channel. For example, a matching entry that is in a third lookup table and that matches current channel state information, a quantity of bits included in a to-be-sent message sequence, and a maximum quantity of bits currently allowed to be transmitted may be determined, where an entry in the third lookup table includes channel state information, a quantity of bits included in a message sequence, a maximum quantity of bits allowed to be transmitted, an information bit quantity, and a transmission bit quantity; and an information bit quantity and a transmission bit quantity that are in the matching entry and that are corresponding to the current channel state information, the quantity of bits included in the to-be-sent message sequence, and the maximum quantity of bits currently allowed to be transmitted are determined as the information bit quantity K and the transmission bit quantity N respectively.

The channel state information (CSI), the quantity of bits in the to-be-sent message sequence, and the maximum quantity of bits allowed to be transmitted in a communications system are obtained. The quantity of bits in the to-be-sent message sequence is a total length of the to-be-sent code block, and also a value of the information bit quantity K. The maximum quantity of bits currently allowed to be transmitted is a quantity of current available physical channels. The present invention is not limited thereto. Any other physical channel parameter from which the information state information, the quantity of bits in the to-be-sent message sequence, or the maximum quantity of bits allowed to be transmitted can be deduced also falls within the scope of the present invention. Further, K and N are determined based on a preset correspondence in the third lookup table. For example, the third lookup table may be of a form described in the following Table 6.

TABLE 6

| Channel state information | Quantity of bits included in a message sequence | Maximum quantity of bits allowed to be transmitted | Information bit quantity | Transmission bit quantity |
|---|---|---|---|---|
| 0 | 128 | 768 | 144 | 768 |
| 0 | 136 | 768 | 152 | 768 |
| ... | ... | ... | ... | ... |
| 7 | 16384 | 32768 | 2066 | 4096 |
| ... | ... | ... | ... | ... |

It should be understood that numeric values in Table 6 are merely illustrative, and the present invention is not limited thereto.

It should be noted that in this embodiment of the present invention, when $M_0=M$, the preset first mapping relationship information and the preset second mapping relationship information may be combined into one piece of mapping relationship information. For example, the preset first mapping relationship information is Table 1, and the preset second mapping relationship information is Table 2. Then, Table 1 and Table 2 may be combined into Table 7.

TABLE 7

| Coded bit quantity | Uncoded bit sequence number set/ coded bit sequence number set | | | | | | |
|---|---|---|---|---|---|---|---|
| 128 | 1 | 2 | 3 | 4 | 5 | ... | 128 |
| 256 | 1 | 2 | 3 | 4 | 5 | ... | 256 |
| 512 | 1 | 2 | 3 | 4 | 5 | ... | 512 |
| | | | ... | | | | |
| 16384 | 1 | 2 | 3 | 4 | 5 | ... | 16384 |

It should be noted that when there is only one piece of mapping relationship information, the mapping relationship information may be used to indicate the one-to-one correspondence between the plurality of coded bit quantities and the plurality of uncoded bit sequence number sets, and the sequence number quantity of each coded bit sequence number set is equal to the coded bit quantity corresponding to the uncoded bit sequence number set; and the mapping relationship information may also be described as being used to indicate the one-to-one correspondence between the plurality of coded bit quantities and the plurality of coded bit sequence number sets, and the sequence number quantity of each coded bit sequence number set is equal to the coded bit quantity corresponding to the coded bit sequence number set.

Correspondingly, when there is only one piece of mapping relationship information, after step 420, the method according to this embodiment of the present invention may further include:

determining, based on the first sequence number set of the M uncoded bits, a third coded bit sequence number set that is of the M coded bits and whose sequence number quantity is M; and selecting, from the third coded bit sequence number set according to a preset third selection rule, N sequence numbers as sequence numbers of the N transmission bits, where the sequence numbers of the N transmission bits are used to represent positions of the N transmission bits in the M coded bits.

It should be understood that the preset third selection rule is a rule pre-agreed on by a transmitter side and a receiver side, that is, a rule known to both the transmitter side and the receiver side in advance. The transmitter side and the receiver side perform encoding or decoding by using the rule. Preferably, the third selection rule in this embodiment of the present invention may be used directly without a need of resetting or re-agreement. For example, the third selection rule in this embodiment of the present invention is a rule that is preset before polar code encoding/decoding. The rule can be used for the transmitter side or the receiver side to select, from the sequence number set of the M coded bits, N sequence numbers as the sequence numbers of the transmission bits.

The determining, based on the first sequence number set of the M uncoded bits, a third coded bit sequence number set includes:

arranging bit sequence numbers in the first sequence number set of the M uncoded bits in a normal order, a reverse order, or a bit-reverse order, to generate the third coded bit sequence number set.

It should be noted that when the third coded bit sequence number set is generated by arranging the bit sequence numbers in the first sequence number set of the M uncoded bits in a normal order, the third coded bit sequence number set is the same as the first sequence number set.

Further, in another embodiment, the selecting, from the third coded bit sequence number set according to a preset third selection rule, N sequence numbers as sequence numbers of the N transmission bits includes:

when N≤M, selecting, from the third coded bit sequence number set in a normal order or a reverse order, the first N sequence numbers as the sequence numbers of the transmission bits; or when N>M, using, as the sequence numbers of the transmission bits, all sequence numbers that are selected from the coded bit sequence number set in a normal order or a reverse order for a plurality of times and whose total quantity is N.

It should be noted that in this embodiment of the present invention, the positions of the K information bits in the M uncoded bits may be determined in a prior-art manner, for example, by searching the first table in FIG. 3. Then, in this embodiment of the present invention, the second coded bit sequence number set that is corresponding to the coded bit quantity M and whose quantity is $M_0$ is obtained based on the coded bit quantity M and the preset second mapping relationship information, and the N sequence numbers are selected from the second coded bit sequence number set according to the preset second selection rule as the sequence numbers of the N transmission bits.

Correspondingly, in another embodiment, a polar code processing method 500 shown in FIG. 5 includes the following operations:

510. Obtain, based on a coded bit quantity M and preset second mapping relationship information, a second coded bit sequence number set that is corresponding to the coded bit quantity M and whose quantity is $M_0$, where the second mapping relationship information is used to indicate a one-to-one correspondence between a plurality of coded bit quantities and a plurality of coded bit sequence number sets, a sequence number quantity of each coded bit sequence number set is greater than or equal to a coded bit quantity corresponding to the coded bit sequence number set, M target coded bits are obtained after polar encoding is performed on M uncoded bits, the M uncoded bits include K information bits, and N bits in the M coded bits are transmitted on an actual channel, where $M_0 \geq M$, $M \geq K$, $M=2^n$, and n, N, K, and $M_0$ are positive integers.

520. Select, from the second coded bit sequence number set according to a preset second selection rule, N sequence numbers as sequence numbers of the N transmission bits, where the sequence numbers of the N transmission bits are used to represent positions of the N transmission bits in the M coded bits.

Therefore, according to this embodiment of the present invention, the second coded bit sequence number set that is corresponding to the target coded bit quantity M and whose quantity is $M_0$ is obtained based on the target coded bit quantity M and the preset second mapping relationship information, and the N sequence numbers are selected from the second coded bit sequence number set according to the preset second selection rule as the sequence numbers of the N transmission bits. Because $M=2^n$, the preset second mapping relationship information may include only a coded bit sequence number set corresponding to a coded bit length $2^n$. Therefore, pre-storage space is greatly saved, and encoding/decoding efficiency of a polar code is improved.

For example, to support all code lengths and code rates specified in LTE, because a length of a mother code of a polar code is limited to a power of 2, for example, when a value range of a code length of the mother code is from 132 to 18444, the code length of the mother code only needs to have eight values: 128, 256, 512, 1024, 2048, 4096, 8192, and 16384. Therefore, in this embodiment of the present invention, only eight correspondences (which, for example, may be entries) need to be stored. Compared with the prior art according to which 3000 entries are stored, this can greatly reduce storage overheads, and improve encoding/decoding efficiency of a polar code.

It should be understood that the preset second selection rule is a rule pre-agreed on by a transmitter side and a receiver side, that is, a rule known to both the transmitter side and the receiver side in advance. The transmitter side and the receiver side perform encoding or decoding by using the rule. Preferably, the second selection rule in this embodiment of the present invention may be used directly without a need of resetting or re-agreement. For example, the second selection rule in this embodiment of the present invention is a rule that is preset before polar code encoding/decoding. The rule can be used for the transmitter side or the receiver side to select, from the set of $M_0$ coded bit sequence numbers, N sequence numbers as the sequence numbers of the transmission bits.

It should be understood that the preset second mapping relationship information in this embodiment of the present invention is information pre-obtained by a transmitter side (for example, an encoder side) and a receiver side (for example, a decoder side). The transmitter side and the receiver side perform encoding and decoding respectively by using the preset first mapping relationship information.

It should be understood that the preset second mapping relationship information in this embodiment of the present invention may have a plurality of representation forms, provided that the one-to-one correspondence between the plurality of coded bit quantities and the plurality of coded bit sequence number sets can be indicated, and that the sequence number quantity of each coded bit sequence number set is greater than or equal to the coded bit quantity corresponding to the coded bit sequence number set. This is not limited in this embodiment of the present invention. For example, the preset second mapping relationship information may be a string of numeric values, or may be in a tabular form or the like.

For example, when $M_0 = M$, the second coded bit sequence number set includes sequence numbers that are of the M coded bits and that are arranged in a normal order, a reverse order, or a bit-reverse order; or when $M_0 > M$, the second coded bit sequence number set includes all or some of sequence numbers of the M coded bits, where the second coded bit sequence number set has at least $(M_0 - M)$ duplicate sequence numbers.

Optionally, in another embodiment, in step 520, when $N \leq M_0$, the first N sequence numbers are selected from the second coded bit sequence number set in a normal order or a reverse order as the sequence numbers of the transmission bits; or when $N > M_0$, all sequence numbers that are selected from the second coded bit sequence number set in a normal order or a reverse order for a plurality of times and whose total quantity is N are used as the sequence numbers of the transmission bits.

It should be noted that the preset second mapping relationship information and methods for, for example, the obtaining, based on a coded bit quantity M and preset second mapping relationship information, a second coded bit sequence number set that is corresponding to the coded bit quantity M and whose quantity is $M_0$ and the selecting, from the second coded bit sequence number set according to a preset second selection rule, N sequence numbers as sequence numbers of the N transmission bits in the embodiment shown in FIG. 5 are corresponding to the preset second mapping relationship information and the method embodiment for determining the sequence numbers of the transmission bits that are described above. To avoid repetition, details are not further described herein.

The foregoing has described the polar code processing method in the embodiments of the present invention with reference to FIG. 1 to FIG. 5. The following details the polar code processing method in the embodiments of the present invention with reference to specific examples given in FIG. 6 and FIG. 7.

Figure 6:
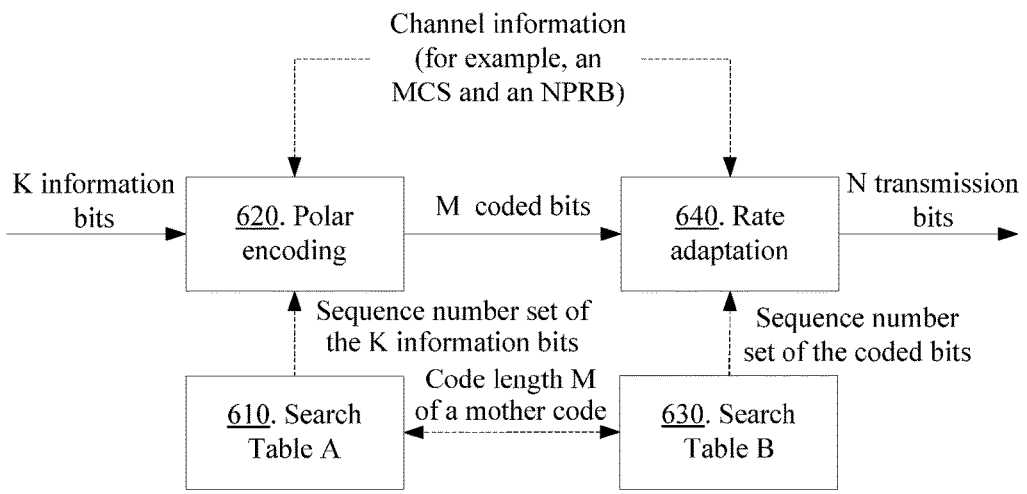
FIG. 6 is a schematic block diagram of a polar code processing method according to another embodiment of the present invention.

FIG. 6 is a schematic block diagram of a polar code processing method according to an embodiment of the present invention. As shown in FIG. 6, when polar encoding is performed, first, a first sequence number set that is corresponding to a coded bit quantity M and whose length is M is obtained based on the coded bit quantity M and preset first mapping relationship information, where the coded bit quantity M is also referred to as a code length of a mother code, and the first mapping relationship information may be in a tabular form. For example, the first mapping relationship information herein is represented by Table A, for example, the foregoing Table 1. Then, K sequence numbers are selected from the first sequence number set according to a first preset rule as a sequence number set of the K information bits. In other words, K bits in M uncoded bits are determined as information bits, and a set A consisting of sequence numbers of the K information bits is determined.

After polar code encoding is performed on the M uncoded bits to obtain the M coded bits, a second coded bit sequence number set that is corresponding to the coded bit quantity M and whose length is $M_0$ also needs to be obtained based on the coded bit quantity M and preset second mapping relationship information. For example, the second mapping relationship information may be in a tabular form. For example, the second mapping relationship information herein is represented by Table B, for example, the foregoing Table 2. $M_0$ is a positive integer. N sequence numbers are selected from the set of $M_0$ coded bit sequence numbers according to a second preset rule as sequence numbers of the transmission bits.

In particular, the coded bit data M may be first determined, and polar encoding is then performed according to the method shown in FIG. 6.

For example, the coded bit quantity M may be determined in the following manner. (1) The transmission bit quantity N and the information bit quantity K may be determined by using signaling in a network system to search a preset table such as Table 6 based on channel information. For example, the channel information may include a quantity of bits included in a to-be-sent message sequence, a maximum quantity of bits currently allowed to be transmitted, a modulation and coding set index $I_{MCS}$, and a number of physical resource blocks $I_{NPRB}$. $I_{MCS}$ and $I_{NPRB}$ jointly determine the maximum quantity of bits currently allowed to be transmitted.

(2) The coded bit quantity M (which is also referred to as a code length M of a mother code of a polar code) is obtained based on a preset maximum transmission code rate $R_{max}$, a preset maximum allowed code length $M_{max}$, a preset minimum allowed code length $M_{min}$, by using the following formula:

$$M = \min\left\{M_{max}, \max\left(M_{min}, 2^{\lceil \log_2 N \rceil}, 2^{\lceil \log_2 \frac{K}{R_{max}} \rceil}\right)\right\}.$$

The method shown in FIG. 6 may include the following processes:

610. Obtain, by searching Table A based on a code length M of a mother code, an information bit sequence number set $a_1^M$ whose length is M, where Table A is first mapping relationship information, and the information bit sequence number set is a first sequence number set; and select K elements from the set in a normal order to form a sequence number set of K information bits. An input for searching Table A is the code length M of the mother code, and an output is the sequence number set of K information bits.

It should be understood that the first sequence number set is obtained by searching Table A. Further, K sequence numbers are selected from the first sequence number set according to a preset first selection rule, for example, in a normal order, as the sequence number set of K information bits. Herein, for the purpose of brief description, the sequence number set of K information bits are used as the output of searching Table A. In the following, searching Table B and searching Table C are similarly described, and details are not described below again.

620. Perform polar encoding on K information bits based on the sequence number set of K information bits that is determined in step 610, to obtain M coded bits. For example, a coded bit sequence is $x_1^M$. Positions of the K information bits are determined in M uncoded bits based on the set of K information bit sequence numbers that is determined in step 610. The other (M−K) bits in the M uncoded bits are frozen bits. Polar encoding is performed on the M uncoded bits to obtain the M coded bits. That is, the M uncoded bits include the K information bits and the (M−K) frozen bits. In other words, an input parameter for the polar encoding is the M uncoded bits, and an output parameter of the polar encoding is the M coded bits.

630. Obtain, by searching Table B based on the code length M of the mother code, a corresponding coded bit sequence number set $b_1^{M_0}$ whose length is $M_0$, where Table B is second mapping relationship information, the coded bit sequence number set is a second coded bit sequence number set, and $M_0 \geq M$. Afterwards, step 640 is performed. An input for searching Table B is the code length M of the mother code, and an output is the coded bit sequence number set $b_1^{M_0}$.

640. Perform rate adaptation. To be specific, N sequence numbers are selected from the coded bit sequence number set $b_1^{M_0}$ obtained in step 630, as a transmission bit sequence number set, and N bits corresponding to the transmission bit sequence number set are used as transmission bits. Details are as follows:

If $N \leq M_0$, the first N sequence numbers are selected from $b_1^{M_0}$ in a normal order, and the transmission bit sequence is determined based on the first N sequence numbers:

$y_i = x_j$, $j = b_i$, $i \in \{1, K, N\}$.

If $N > M_0$, $M_0$ sequence numbers are first selected in a normal order, at most $M_0$ sequence numbers are then selected from $b_1^{M_0}$ in a normal order or a reverse order, and another at most $M_0$ sequence numbers are selected from $b_1^{M_0}$ in a normal order or a reverse order, . . . , until N sequence numbers are selected.

Figure 7:
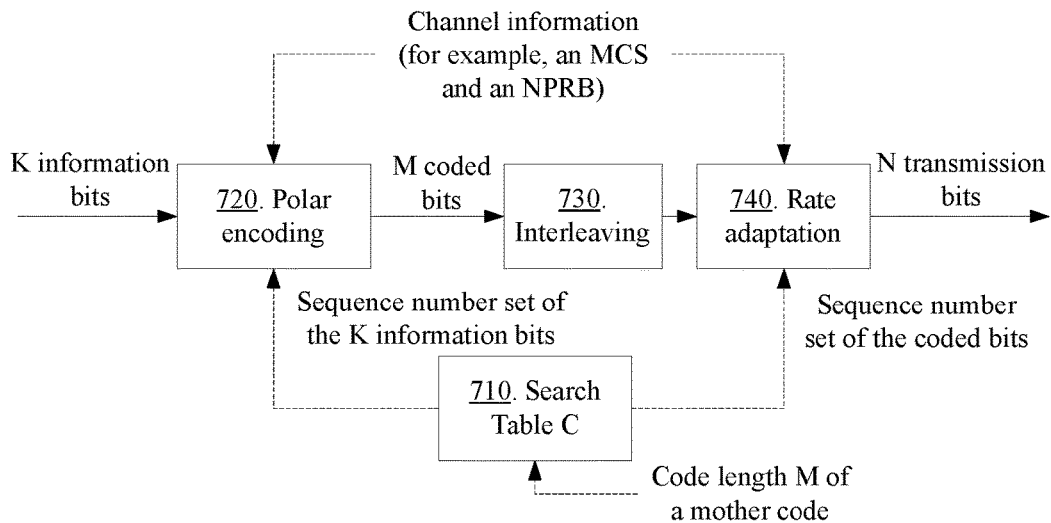
FIG. 7 is a schematic block diagram of a polar code processing method according to another embodiment of the present invention.

FIG. 7 is a schematic block diagram of a polar code processing method according to an embodiment of the present invention. FIG. 7 is a schematic block diagram of polar code processing in a case in which when $M_0 = M$, preset first mapping relationship information and preset second mapping relationship information are combined into one piece of mapping relationship information. For example, the mapping relationship information may be in a tabular form. The correspondence herein is referred to as Table C, for example, the foregoing Table 7. As shown in FIG. 7, when polar encoding is performed, first, a first sequence number set that is corresponding to a coded bit quantity M and whose length is M is obtained based on the coded bit quantity M and preset mapping relationship information such as Table C, where the coded bit quantity M is also referred to as a code length of a mother code. Then, K sequence numbers are selected from the first sequence number set according to a first preset rule as a sequence number set of K information bits. In other words, K bits in M uncoded bits are determined as information bits, and a set A consisting of sequence numbers of the K information bits is determined.

After polar code encoding is performed on the M uncoded bits to obtain the M coded bits, N sequence numbers also need to be selected as the sequence numbers of the transmission bits.

In particular, the coded bit quantity M may be first determined, and polar encoding is then performed according to the method shown in FIG. 7.

For example, the coded bit quantity M may be determined in the following manner. (1) The transmission bit quantity N and the information bit quantity K may be determined by using signaling in a network system to search a preset table such as Table 6 based on channel information. For example, the channel information may include a quantity of bits included in a to-be-sent message sequence, a maximum quantity of bits currently allowed to be transmitted, a modulation and coding set index $I_{MCS}$, and a number of physical resource blocks $I_{NPRB}$. $I_{MCS}$ and $I_{NPRB}$ jointly determine the maximum quantity of bits currently allowed to be transmitted.

(2) The coded bit quantity M (which is also referred to as a code length M of a mother code of a polar code) is obtained based on a preset maximum transmission code rate $R_{max}$, a preset maximum allowed code length $M_{max}$, a preset minimum allowed code length $M_{min}$, by using the following formula:

$$M = \min\left\{M_{max}, \max\left(M_{min}, 2^{\lceil \log_2 N \rceil}, 2^{\lceil \log_2 \frac{K}{R_{max}} \rceil}\right)\right\}.$$

The method shown in FIG. 7 may include the following processes:

710. Select a corresponding sequence $C_1^M$ from a lookup Table C based on a code length M of a mother code, where the corresponding sequence is a first sequence number set; select K elements from the sequence in a normal order to form a sequence number set of K information bits, and perform polar encoding based on the sequence number set of K information bits. An input for searching Table C is the code length M of the mother code, and an output is the sequence number set of K information bits.

720. Perform polar encoding on K information bits based on the sequence number set of K information bits that is obtained in step 710, to obtain M coded bits. For example, a coded bit sequence is $v_1^M$. Positions of the K information bits are determined in M uncoded bits based on the sequence number set of K information bits that is determined in step 710. The other (M−K) bits in the M uncoded bits are frozen bits. Polar encoding is performed on the M uncoded bits to obtain the M coded bits. That is, the M uncoded bits include the K information bits and the (M−K) frozen bits. In other words, an input parameter for the polar encoding is the M uncoded bits, and an output parameter of the polar encoding is the M coded bits.

730. Obtain a bit sequence $x_1^M$ after reverse interleaving is performed on the coded bit sequence $v_1^M$ that is output by a mother code encoder, where the bit sequence is a third coded bit sequence number set. It should be understood that in actual application, interleaving processing may not need to be performed. In other words, step 730 is an optional step, and whether step 730 is performed may be determined based on an actual situation. This embodiment of the present invention is not limited in this sense.

740. Perform rate adaptation to obtain a transmission bit sequence number set. To be specific, N sequence numbers are selected from the coded bit sequence number set $x_1^M$ obtained in step 730, as the transmission bit sequence number set, and N bits corresponding to the transmission bit sequence number set are used as transmission bits. If $N \leq M_0$, the first N sequence numbers are selected from the third coded bit sequence number set $x_1^M$ in a normal order, and a transmission bit sequence is determined based on the first N sequence numbers; or if $N > M_0$, $M_0$ sequence numbers are first selected from $X_1^M$ in a normal order, at most $M_0$ sequence numbers are then selected from $x_1^M$ in a normal order or a reverse order, and another at most $M_0$ sequence numbers are selected from $b_1^{M_0}$ in a normal order or a reverse order, . . . , until N sequence numbers are selected.

It should be understood that when step 730 is not performed, $x_1^M$ in step 740 may be replaced with $c_1^M$. To be specific, the third sequence number set is the same as the foregoing first sequence number set. However, physical meanings represented by the third sequence number set and the first sequence number set are different. The third sequence number set represents a sequence number set of M coded bits, and the first sequence number set represents a sequence number set of M uncoded bits.

It should be understood that all lookup tables and computation rules in the foregoing processes of this specification are stored in a signal transmitter side and a signal receiver side, so that the transmitter side and the receiver side perform encoding and decoding based on a pre-stored mapping relationship according to an agreed rule.

It should be noted that the specific examples in FIG. 6 and FIG. 7 are provided merely for helping a person skilled in the art to understand the embodiments of the present invention rather than limiting the embodiments of the present invention to the specific numeric values or specific scenarios shown in FIG. 6 and FIG. 7. Obviously, a person skilled in the art can make various equivalent modifications or variations based on the examples given in FIG. 6 and FIG. 7, and such modifications and variations shall also fall within the scope of the embodiments of the present invention.

The foregoing has described the polar code processing method in the embodiments of the present invention with reference to FIG. 1 to FIG. 7. The following describes a polar code processing communications device in the embodiments of the present invention with reference to FIG. 8 to FIG. 11.

Figure 8:
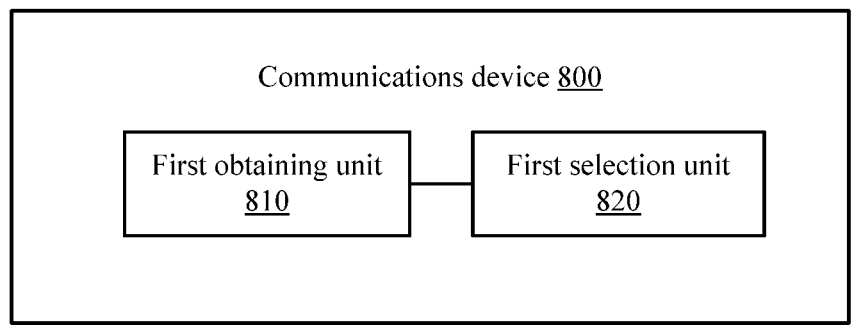
FIG. 8 is a schematic block diagram of a polar code processing communications device according to an embodiment of the present invention.

FIG. 8 is a schematic block diagram of a polar code processing communications device according to an embodiment of the present invention. The communications device may be configured to encode or decode a polar code. For example, the communications device may be a base station or a terminal. This is not limited in this embodiment of the present invention. It should be understood that the communications device 800 shown in FIG. 8 can implement all processes for processing a polar code that are included in the embodiment shown in FIG. 4, and operations and/or functions of all modules in the communications device 800 aim to implement the corresponding processes in the method embodiment shown in FIG. 4. For details, refer to the description of the foregoing method embodiment. To avoid repetition, detailed descriptions are omitted where appropriate.

The communications device 800 shown in FIG. 8 includes a first obtaining unit 810 and the first selection unit 820.

The first obtaining unit 810 is configured to obtain, based on a target coded bit quantity M and preset first mapping relationship information, a first sequence number set of M uncoded bits that is corresponding to the target coded bit quantity M, where the first mapping relationship information is used to indicate a one-to-one correspondence between a plurality of coded bit quantities and a plurality of uncoded bit sequence number sets, the M uncoded bits include K information bits, M target coded bits are obtained after polar encoding is performed on the M uncoded bits, and N bits in the M coded bits are transmitted on an actual channel, where $M \geq K$, $M=2^n$, and n, N, and K are positive integers.

The first selection unit 820 is configured to select, from the first sequence number set of the M uncoded bits according to a preset first selection rule, K sequence numbers as a sequence number set of the K information bits, where the K sequence numbers are used to represent positions of the K information bits in the M uncoded bits.

Therefore, according to this embodiment of the present invention, the first sequence number set of the M uncoded bits that is corresponding to the target coded bit quantity M is obtained based on the target coded bit quantity M and the preset first mapping relationship information, and the K sequence numbers are selected from the first sequence number set of the M uncoded bits according to the preset first selection rule as the sequence number set of the K information bits. Because $M=2^n$, the preset first mapping relationship information may include only a coded bit sequence number set corresponding to a coded bit length $2^n$. Therefore, pre-storage space is greatly saved, and encoding/decoding efficiency of a polar code is improved.

Further, in another embodiment, the first selection unit 810 is configured to select, from the first sequence number set of the M uncoded bits in a normal order or a reverse order, K sequence numbers as the sequence number set of the K information bits of the to-be-encoded data.

Optionally, in another embodiment, the communications device 800 further includes:

a second obtaining unit, configured to: after the first selection unit selects, from the first sequence number set of the M uncoded bits according to the preset first selection rule, the K sequence numbers as the sequence number set of the K information bits, obtain, based on the target coded bit quantity M and preset second mapping relationship information, a second coded bit sequence number set that is corresponding to the target coded bit quantity M and whose quantity is $M_0$, where the second mapping relationship information is used to indicate a one-to-one correspondence between a plurality of coded bit quantities and a plurality of coded bit sequence number sets, and a sequence number quantity of each coded bit sequence number set is greater than or equal to a coded bit quantity corresponding to the coded bit sequence number set, where $M_0 \geq M$, and $M_0$ is a positive integer; and a second selection unit, configured to select, from the second coded bit sequence number set according to a preset second selection rule, N sequence numbers as sequence numbers of the N transmission bits, where the sequence numbers of the N transmission bits are used to represent positions of the N transmission bits in the M coded bits.

Optionally, in another embodiment, when $M_0=M$, the second coded bit sequence number set includes sequence numbers that are of the M coded bits and that are arranged in a normal order, a reverse order, or a bit-reverse order; or when $M_0>M$, the second coded bit sequence number set includes all or some of sequence numbers of the M coded bits, where the second coded bit sequence number set has at least $(M_0-M)$ duplicate sequence numbers.

Further, in another embodiment, the second selection unit is configured to:

when $N \leq M_0$, select, from the second coded bit sequence number set in a normal order or a reverse order, the first N sequence numbers as the sequence numbers of the transmission bits; or when $N>M_0$, use, as the sequence numbers of the transmission bits, all sequence numbers that are selected from the second coded bit sequence number set in a normal order or a reverse order for a plurality of times and whose total quantity is N.

Alternatively, in another embodiment, the communications device 800 may further include:

a determining unit, configured to determine, based on the first sequence number set of the M uncoded bits, a third coded bit sequence number set that is of the M coded bits and whose sequence number quantity is M; and a third selection unit, configured to select, from the third coded bit sequence number set according to a preset third selection rule, N sequence numbers as sequence numbers of the N transmission bits, where the sequence numbers of the N transmission bits are used to represent positions of the N transmission bits in the M coded bits.

Further, in another embodiment, the determining unit is configured to: arrange bit sequence numbers in the first sequence number set of the M uncoded bits in a normal order, a reverse order, or a bit-reverse order, to generate the third coded bit sequence number set.

Further, in another embodiment, the third selection unit is configured to:

when $N \leq M$, select, from the third coded bit sequence number set in a normal order or a reverse order, the first N sequence numbers as the sequence numbers of the transmission bits; or when $N>M$, use, as the sequence numbers of the transmission bits, all sequence numbers that are selected from the coded bit sequence number set in a normal order or a reverse order for a plurality of times and whose total quantity is N.

Figure 9:
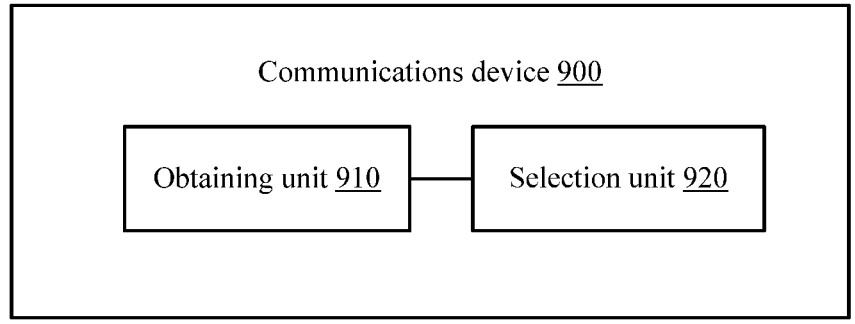
FIG. 9 is a schematic block diagram of a polar code processing communications device according to another embodiment of the present invention.

FIG. 9 is a schematic block diagram of a polar code processing communications device according to another embodiment of the present invention. The communications device may be configured to encode or decode a polar code. For example, the communications device may be a base station or a terminal. This is not limited in this embodiment of the present invention. It should be understood that the communications device 900 shown in FIG. 9 can implement all processes for processing a polar code that are included in the embodiment shown in FIG. 5, and operations and/or functions of all modules in the communications device 900 aim to implement the corresponding processes in the method embodiment shown in FIG. 5. For details, refer to the description of the foregoing method embodiment. To avoid repetition, detailed descriptions are omitted where appropriate.

The communications device 900 shown in FIG. 9 includes an obtaining unit 910 and a selection unit 920.

The obtaining unit 910 is configured to obtain, based on a coded bit quantity M and preset second mapping relationship information, a second coded bit sequence number set that is corresponding to the coded bit quantity M and whose quantity is $M_0$, where the second mapping relationship information is used to indicate a one-to-one correspondence between a plurality of coded bit quantities and a plurality of coded bit sequence number sets, a sequence number quantity of each coded bit sequence number set is greater than or equal to a coded bit quantity corresponding to the coded bit sequence number set, M target coded bits are obtained after polar encoding is performed on M uncoded bits, the M uncoded bits include K information bits, and N bits in the M coded bits are transmitted on an actual channel, where $M_0 \geq M$, $M \geq K$, $M=2^n$, and n, N, K, and $M_0$ are positive integers.

The selection unit 920 is configured to select, from the second coded bit sequence number set according to a preset second selection rule, N sequence numbers as sequence numbers of the N transmission bits, where the sequence numbers of the N transmission bits are used to represent positions of the N transmission bits in the M coded bits.

Therefore, according to this embodiment of the present invention, the second coded bit sequence number set that is corresponding to the target coded bit quantity M and whose quantity is $M_0$ is obtained based on the target coded bit quantity M and the preset second mapping relationship information, and the N sequence numbers are selected from the second coded bit sequence number set according to the preset second selection rule as the sequence numbers of the N transmission bits. Because $M=2^n$, the preset second mapping relationship information may include only a coded bit sequence number set corresponding to a coded bit length $2^n$. Therefore, pre-storage space is greatly saved, and encoding/decoding efficiency of a polar code is improved.

Optionally, in another embodiment, when $M_0=M$, the second coded bit sequence number set includes sequence numbers that are of the M coded bits and that are arranged in a normal order, a reverse order, or a bit-reverse order; or when $M_0 > M$, the second coded bit sequence number set includes all or some of sequence numbers of the M coded bits, where the second coded bit sequence number set has at least ($M_0 - M$) duplicate sequence numbers.

Further, in another embodiment, the selection unit 920 is configured to:

when $N \leq M_0$, select, from the second coded bit sequence number set in a normal order or a reverse order, the first N sequence numbers as the sequence numbers of the transmission bits; or when $N > M_0$, use, as the sequence numbers of the transmission bits, all sequence numbers that are selected from the second coded bit sequence number set in a normal order or a reverse order for a plurality of times and whose total quantity is N.

Figure 10:
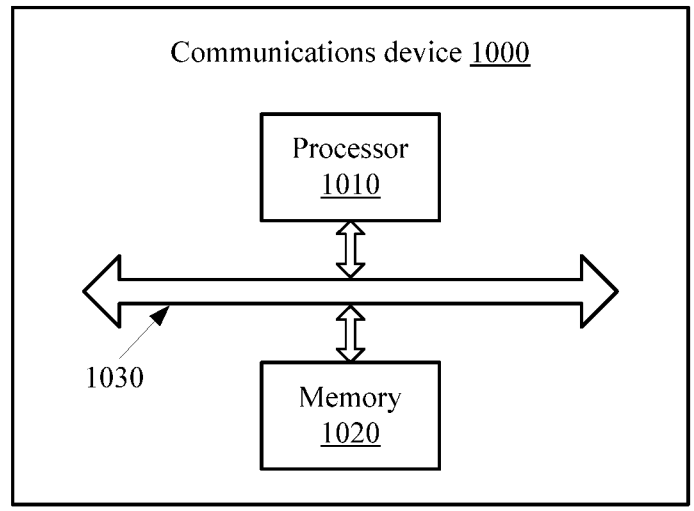
FIG. 10 is a schematic block diagram of a polar code processing communications device according to another embodiment of the present invention.

FIG. 10 is a schematic block diagram of a polar code processing communications device according to an embodiment of the present invention. The communications device may be configured to encode or decode a polar code. For example, the communications device may be a base station or a terminal. This is not limited in this embodiment of the present invention. It should be understood that the communications device 1000 shown in FIG. 10 can implement all processes for processing a polar code that are included in the embodiment shown in FIG. 4, and operations and/or functions of all modules in the communications device 1000 aim to implement the corresponding processes in the method embodiment shown in FIG. 4. For details, refer to the description of the foregoing method embodiment. To avoid repetition, detailed descriptions are omitted where appropriate.

The communications device 1000 shown in FIG. 10 includes a processor 1010, a memory 1020, and a bus system 1030. The processor 1010 and the memory 1020 are connected by the bus system 1030. The memory 1020 is configured to store an instruction. The processor 1010 is configured to execute the instruction stored in the memory 1020 to perform the following operations: obtaining, based on a target coded bit quantity M and preset first mapping relationship information, a first sequence number set of M uncoded bits that is corresponding to the target coded bit quantity M, where the first mapping relationship information is used to indicate a one-to-one correspondence between a plurality of coded bit quantities and a plurality of uncoded bit sequence number sets, the M uncoded bits include K information bits, M target coded bits are obtained after polar encoding is performed on the M uncoded bits, and N bits in the M coded bits are transmitted on an actual channel, where $M \geq K$, $M=2^n$, and n, N, and K are positive integers; and selecting, from the first sequence number set of the M uncoded bits according to a preset first selection rule, K sequence numbers as a sequence number set of the K information bits, where the K sequence numbers are used to represent positions of the K information bits in the M uncoded bits.

Therefore, according to this embodiment of the present invention, the first sequence number set of the M uncoded bits that is corresponding to the target coded bit quantity M is obtained based on the target coded bit quantity M and the preset first mapping relationship information, and the K sequence numbers are selected from the first sequence number set of the M uncoded bits according to the preset first selection rule as the sequence number set of the K information bits. Because $M=2^n$, the preset first mapping relationship information may include only a coded bit sequence number set corresponding to a coded bit length $2^n$. Therefore, pre-storage space is greatly saved, and encoding/decoding efficiency of a polar code is improved.

The method disclosed in the embodiments of the present invention may be applied to the processor 1010, or implemented by the processor 1010. The processor 1010 may be an integrated circuit chip with a signal processing capability. In an implementation process, the operations of the foregoing method may be implemented by an integrated logic circuit of hardware in the processor 1010, or by a software instruction. The processor 1010 may be a general purpose processor, a digital signal processor (DSP), an application-specific integrated circuit (ASIC), a field programmable gate array (FPGA) or another programmable logic device, a discrete gate or transistor logic device, or a discrete hardware component. The processor 1010 may implement or execute the methods, operations and logical block diagrams disclosed in the embodiments of the present invention. The general purpose processor may be a microprocessor, or the processor may also be any conventional processor or the like. The operations of the methods disclosed with reference to the embodiments of the present invention may be directly implemented by a hardware decoding processor, or may be implemented by a combination of hardware and a software module in a decoding processor. The software module may be located in a storage medium that is mature in the art, such as a random access memory (RAM), a flash memory, a read-only memory (ROM), a programmable read-only memory or an electrically erasable programmable memory, or a register. The storage medium is located in the memory 1020. The processor 1010 reads information in the memory 1020 and completes, together with hardware of the processor 1010, the operations of the foregoing methods. In addition to a data bus, the bus system 1030 may include a power bus, a control bus, a status signal bus, and the like. However, for clear description, various buses are denoted by the bus system 1030 in the figure.

Further, in another embodiment, the processor 1010 can be configured to select, from the first sequence number set of the M uncoded bits in a normal order or a reverse order, K sequence numbers as the sequence number set of the K information bits of the to-be-encoded data.

Optionally, in another embodiment, the processor 1010 is further configured to: after the first selection unit selects, from the first sequence number set of the M uncoded bits according to the preset first selection rule, the K sequence numbers as the sequence number set of the K information bits, obtain, based on the target coded bit quantity M and preset second mapping relationship information, a second coded bit sequence number set that is corresponding to the target coded bit quantity M and whose quantity is $M_0$, where the second mapping relationship information is used to indicate a one-to-one correspondence between a plurality of coded bit quantities and a plurality of coded bit sequence number sets, and a sequence number quantity of each coded bit sequence number set is greater than or equal to a coded bit quantity corresponding to the coded bit sequence number set, where $M_0 \geq M$, and $M_0$ is a positive integer; and select, from the second coded bit sequence number set according to a preset second selection rule, N sequence numbers as sequence numbers of the N transmission bits, where the sequence numbers of the N transmission bits are used to represent positions of the N transmission bits in the M coded bits.

Optionally, in another embodiment, when $M_0=M$, the second coded bit sequence number set includes sequence numbers that are of the M coded bits and that are arranged in a normal order, a reverse order, or a bit-reverse order; or when $M_0>M$, the second coded bit sequence number set includes all or some of sequence numbers of the M coded bits, where the second coded bit sequence number set has at least ($M_0-M$) duplicate sequence numbers.

Further, in another embodiment, the processor 1010 can be configured to: when $N \leq M_0$, select, from the second coded bit sequence number set in a normal order or a reverse order, the first N sequence numbers as the sequence numbers of the transmission bits; or when $N>M_0$, use, as the sequence numbers of the transmission bits, all sequence numbers that are selected from the second coded bit sequence number set in a normal order or a reverse order for a plurality of times and whose total quantity is N.

Alternatively, in another embodiment, the processor 1010 is further configured to: determine, based on the first sequence number set of the M uncoded bits, a third coded bit sequence number set that is of the M coded bits and whose sequence number quantity is M; and select, from the third coded bit sequence number set according to a preset third selection rule, N sequence numbers as sequence numbers of the N transmission bits, where the sequence numbers of the N transmission bits are used to represent positions of the N transmission bits in the M coded bits.

Further, in another embodiment, the processor 1010 is configured to: arrange bit sequence numbers in the first sequence number set of the M uncoded bits in a normal order, a reverse order, or a bit-reverse order, to generate the third coded bit sequence number set.

Further, in another embodiment, the processor 1010 can be configured to:

when $N \leq M$, select, from the third coded bit sequence number set in a normal order or a reverse order, the first N sequence numbers as the sequence numbers of the transmission bits; or when $N>M$, use, as the sequence numbers of the transmission bits, all sequence numbers that are selected from the coded bit sequence number set in a normal order or a reverse order for a plurality of times and whose total quantity is N.

Figure 11:
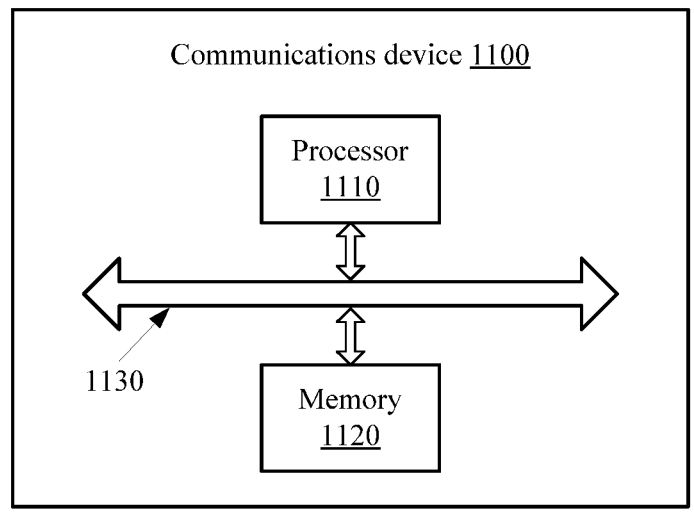
FIG. 11 is a schematic block diagram of a polar code processing communications device according to another embodiment of the present invention.

FIG. 11 is a schematic block diagram of a polar code processing communications device according to another embodiment of the present invention. The communications device may be configured to encode or decode a polar code. For example, the communications device may be a base station or a terminal. This is not limited in this embodiment of the present invention. It should be understood that the communications device 1100 shown in FIG. 11 can implement all processes for processing a polar code that are included in the embodiment shown in FIG. 5, and operations and/or functions of all modules in the communications device 1100 aim to implement the corresponding processes in the method embodiment shown in FIG. 5. For details, refer to the description of the foregoing method embodiment. To avoid repetition, detailed descriptions are omitted where appropriate.

The communications device 1100 shown in FIG. 11 includes a processor 1110, a memory 1120, and a bus system 1130. The processor 1110 and the memory 1120 are connected by the bus system 1130. The memory 1120 is configured to store an instruction. The processor 1110 is configured to execute the instruction stored in the memory 1120 to perform the following operations: obtaining, based on a target coded bit quantity M and preset second mapping relationship information, a second coded bit sequence number set that is corresponding to the coded bit quantity M and whose quantity is $M_0$, where the second mapping relationship information is used to indicate a one-to-one correspondence between a plurality of coded bit quantities and a plurality of coded bit sequence number sets, a sequence number quantity of each coded bit sequence number set is greater than or equal to a coded bit quantity corresponding to the coded bit sequence number set, M target coded bits are obtained after polar encoding is performed on M uncoded bits, the M uncoded bits include K information bits, and N bits in the M coded bits are transmitted on an actual channel, where $M_0 \geq M$, $M \geq K$, $M=2^n$, and n, N, K, and $M_0$ are positive integers; and select, from the second coded bit sequence number set according to a preset second selection rule, N sequence numbers as sequence numbers of the N transmission bits, where the sequence numbers of the N transmission bits are used to represent positions of the N transmission bits in the M coded bits.

Therefore, according to this embodiment of the present invention, the second coded bit sequence number set that is corresponding to the target coded bit quantity M and whose quantity is $M_0$ is obtained based on the target coded bit quantity M and the preset second mapping relationship information, and the N sequence numbers are selected from the second coded bit sequence number set according to the preset second selection rule as the sequence numbers of the N transmission bits. Because $M=2^n$, the preset second mapping relationship information may include only a coded bit sequence number set corresponding to a coded bit length $2^n$. Therefore, pre-storage space is greatly saved, and encoding/decoding efficiency of a polar code is improved.

The methods disclosed in the embodiments of the present invention may be applied to the processor 1110, or implemented by the processor 1110. The processor 1110 may be an integrated circuit chip with a signal processing capability. In an implementation process, the operations of the foregoing method may be implemented by an integrated logic circuit of hardware in the processor 1110, or by a software instruction. The processor 1110 may be a general purpose processor, a digital signal processor (DSP), an application-specific integrated circuit (ASIC), a field programmable gate array (FPGA) or another programmable logic device, a discrete gate or transistor logic device, or a discrete hardware component. The processor 1110 may implement or execute the methods, operations and logical block diagrams disclosed in the embodiments of the present invention. The general purpose processor may be a microprocessor, or the processor may also be any conventional processor or the like. The operations of the methods disclosed with reference to the embodiments of the present invention may be directly implemented by a hardware decoding processor, or may be implemented by a combination of hardware and a software module in a decoding processor. The software module may be located in a storage medium that is mature in the art, such as a random access memory (RAM), a flash memory, a read-only memory (ROM), a programmable read-only memory or an electrically erasable programmable memory, or a register. The storage medium is located in the memory 1120. The processor 1110 reads information in the memory 1120 and completes, together with hardware of the processor 1110, the operations of the foregoing method. In addition to a data bus, the bus system 1130 may include a power bus, a control bus, a status signal bus, and the like. However, for clear description, various buses are denoted by the bus system 1130 in the figure.

Optionally, in another embodiment, when $M_0=M$, the second coded bit sequence number set includes sequence numbers that are of the M coded bits and that are arranged in a normal order, a reverse order, or a bit-reverse order; or when $M_0>M$, the second coded bit sequence number set includes all or some of sequence numbers of the M coded bits, where the second coded bit sequence number set has at least $(M_0-M)$ duplicate sequence numbers.

Further, in another embodiment, the processor 1100 can be configured to:

when $N \leq M_0$, select, from the second coded bit sequence number set in a normal order or a reverse order, the first N sequence numbers as the sequence numbers of the transmission bits; or when $N>M_0$, use, as the sequence numbers of the transmission bits, all sequence numbers that are selected from the second coded bit sequence number set in a normal order or a reverse order for a plurality of times and whose total quantity is N.

It should be understood that "one embodiment" or "an embodiment" mentioned throughout the specification indicates that a particular feature, structure or property that is related to the embodiment is included in at least one embodiment of the present invention. Therefore, "in one embodiment" or "in an embodiment" that appears throughput the entire specification does not necessarily mean a same embodiment. Furthermore, the particular feature, structure, or property may be combined in one or more embodiments in any manner where appropriate. It should be understood that sequence numbers of the foregoing processes do not mean execution sequences in various embodiments of the present invention. The execution sequences of the processes should be determined based on functions and internal logic of the processes, and should not be construed as any limitation on the implementation processes of the embodiments of the present invention.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of the present invention, "B corresponding to A" indicates that B is associated with A, and B may be determined according to A. However, it should further be understood that determining B according to A does not mean that B is determined according to A only; that is, B may also be determined according to A and/or other information.

A person of ordinary skill in the art may be aware that, the units and operations in the examples described with reference to the embodiments disclosed herein may be implemented by electronic hardware, computer software, or a combination thereof. To clearly describe the interchangeability between hardware and software, the foregoing has generally described compositions and operations of each example based on functions. Whether the functions are performed by hardware or software depends on particular applications and design constraint conditions of the technical solutions. A person skilled in the art may use a different method to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate. Parts displayed as units may or may not be physical units, and may be located in one position or distributed into a plurality of network units. Some or all of the units may be selected based on actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

For the foregoing embodiment descriptions, a person skilled in the art may clearly understand that the present invention may be implemented by hardware, firmware, or a combination thereof When the present invention is implemented by software, the foregoing functions may be stored in a computer-readable medium or transmitted as one or more instructions or code in the computer-readable medium. The computer-readable medium includes a computer storage medium and a communications medium. The communications medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be defined as a computer-readable medium where appropriate. For example, if software is transmitted from a website, a server or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in a definition of a medium to which they belong. For example, a disk (Disk) and disc (disc) used by the present invention includes a compact disc (CD), a laser disc, an optical disc, a digital versatile disc (DVD), a floppy disk and a Blu-ray disc. The disk generally copies data in a magnetic way, and the disc copies data optically using laser. The foregoing combination should also be included in the protection scope of the computer-readable medium.

In conclusion, what is described above is merely examples of embodiments of the technical solutions of the present invention, but is not intended to limit the protection scope of the present invention. Any modification, equivalent replacement, or improvement made without departing from the spirit and principle of the present invention shall fall within the protection scope of the present invention.

What is claimed is:

1. A polar code processing method, comprising:
   obtaining, based on a target coded bit quantity M and preset first mapping relationship information, a first sequence number set of M uncoded bits corresponding to the target coded bit quantity M, wherein the first mapping relationship information indicates a one-to-one correspondence between a plurality of coded bit quantities and a plurality of uncoded bit sequence number sets, the M uncoded bits comprise K information bits, M target coded bits are obtained after polar encoding is performed on the M uncoded bits, and N bits in the M coded bits are transmitted on an actual channel, wherein M≥K, $M=2^n$, and n, N, and K are positive integers; and
   selecting, from the first sequence number set of the M uncoded bits according to a preset first selection rule, K sequence numbers as a sequence number set of the K information bits, wherein the K sequence numbers are used to represent positions of the K information bits in the M uncoded bits.

2. The method according to claim 1, wherein
   the selecting, from the first sequence number set of the M uncoded bits according to a preset first selection rule, K sequence numbers as a sequence number set of the K information bits comprises:
   selecting, from the first sequence number set of the M uncoded bits in a normal order or a reverse order, K sequence numbers as the sequence number set of the K information bits of to-be-encoded data.

3. The method according to claim 1, wherein after the selecting, from the first sequence number set of the M uncoded bits according to a preset first selection rule, K sequence numbers as a sequence number set of the K information bits, the method further comprises:
   obtaining, based on the target coded bit quantity M and preset second mapping relationship information, a second coded bit sequence number set corresponding to the target coded bit quantity M and whose quantity is $M_0$, wherein the second mapping relationship information indicates a one-to-one correspondence between a plurality of coded bit quantities and a plurality of coded bit sequence number sets, and a sequence number quantity of each coded bit sequence number set is greater than or equal to a coded bit quantity corresponding to the coded bit sequence number set, wherein $M_0 \geq M$, and $M_0$ is a positive integer; and
   selecting, from the second coded bit sequence number set according to a preset second selection rule, N sequence numbers as sequence numbers of the N transmission bits, wherein the sequence numbers of the N transmission bits are used to represent positions of the N transmission bits in the M coded bits.

4. The method according to claim 3, wherein
   when $M_0=M$, the second coded bit sequence number set comprises sequence numbers that are of the M coded bits and that are arranged in a normal order, a reverse order, or a bit-reverse order; or
   when $M_0>M$, the second coded bit sequence number set comprises all or some of sequence numbers of the M coded bits, wherein the second coded bit sequence number set has at least $(M_0-M)$ duplicate sequence numbers.

5. The method according to claim 3, wherein
   the selecting, from the second coded bit sequence number set according to a preset second selection rule, N sequence numbers as sequence numbers of the N transmission bits comprises:
   when $N \leq M_0$, selecting, from the second coded bit sequence number set in a normal order or a reverse order, the first N sequence numbers as the sequence numbers of the transmission bits; or
   when $N > M_0$, using, as the sequence numbers of the transmission bits, all sequence numbers that are selected from the second coded bit sequence number set in a normal order or a reverse order for a plurality of times and whose total quantity is N.

6. The method according to claim 1, wherein the method further comprises:
   determining, based on the first sequence number set of the M uncoded bits, a third coded bit sequence number set that is of the M coded bits and whose sequence number quantity is M; and
   selecting, from the third coded bit sequence number set according to a preset third selection rule, N sequence numbers as sequence numbers of the N transmission bits, wherein the sequence numbers of the N transmission bits are used to represent positions of the N transmission bits in the M coded bits.

7. The method according to claim 6, wherein
   the determining, based on the first sequence number set of the M uncoded bits, a third coded bit sequence number set comprises:
   arranging bit sequence numbers in the first sequence number set of the M uncoded bits in a normal order, a reverse order, or a bit-reverse order, to generate the third coded bit sequence number set.

8. The method according to claim 6, wherein
   the selecting, from the third coded bit sequence number set according to a preset third selection rule, N sequence numbers as sequence numbers of the N transmission bits comprises:
   when $N \leq M$, selecting, from the third coded bit sequence number set in a normal order or a reverse order, the first N sequence numbers as the sequence numbers of the transmission bits; or
   when $N > M$, using, as the sequence numbers of the transmission bits, all sequence numbers that are selected from the coded bit sequence number set in a normal order or a reverse order for a plurality of times and whose total quantity is N.

9. A polar code processing method, comprising:
obtaining, based on a coded bit quantity M and preset second mapping relationship information, a second coded bit sequence number set corresponding to the coded bit quantity M and whose quantity is $M_0$, wherein the second mapping relationship information indicates a one-to-one correspondence between a plurality of coded bit quantities and a plurality of coded bit sequence number sets, a sequence number quantity of each coded bit sequence number set is greater than or equal to a coded bit quantity corresponding to the coded bit sequence number set, M target coded bits are obtained after polar encoding is performed on M uncoded bits, the M uncoded bits comprise K information bits, and N bits in the M coded bits are transmitted on an actual channel, wherein $M_0 \geq M$, $M \geq K$, $M=2^n$, and n, N, K, and $M_0$ are positive integers; and
selecting, from the second coded bit sequence number set according to a preset second selection rule, N sequence numbers as sequence numbers of the N transmission bits, wherein the sequence numbers of the N transmission bits are used to represent positions of the N transmission bits in the M coded bits.

10. The method according to claim 9, wherein
when $M_0=M$, the second coded bit sequence number set comprises sequence numbers that are of the M coded bits and that are arranged in a normal order, a reverse order, or a bit-reverse order; or
when $M_0>M$, the second coded bit sequence number set comprises all or some of sequence numbers of the M coded bits, wherein the second coded bit sequence number set has at least ($M_0-M$) duplicate sequence numbers.

11. The method according to claim 10, wherein
the selecting, from the second coded bit sequence number set according to a preset second selection rule, N sequence numbers as sequence numbers of the N transmission bits comprises:
when $N \leq M_0$, selecting, from the second coded bit sequence number set in a normal order or a reverse order, the first N sequence numbers as the sequence numbers of the transmission bits; or
when $N > M_0$, using, as the sequence numbers of the transmission bits, all sequence numbers that are selected from the second coded bit sequence number set in a normal order or a reverse order for a plurality of times and whose total quantity is N.

12. A polar code processing communications device, comprising:
an instruction storing memory and a processor; wherein when the processor executes the instructions stored in the memory, performs operations to: obtain, based on a target coded bit quantity M and preset first mapping relationship information, a first sequence number set of M uncoded bits corresponding to the target coded bit quantity M, wherein the first mapping relationship information indicates a one-to-one correspondence between a plurality of coded bit quantities and a plurality of uncoded bit sequence number sets, the M uncoded bits comprise K information bits, M target coded bits are obtained after polar encoding is performed on the M uncoded bits, and N bits in the M coded bits are transmitted on an actual channel, wherein $M \geq K$, $M=2^n$, and n, N, and K are positive integers; and
select, from the first sequence number set of the M uncoded bits according to a preset first selection rule, K sequence numbers as a sequence number set of the K information bits, wherein the K sequence numbers are used to represent positions of the K information bits in the M uncoded bits.

13. The communications device according to claim 12, wherein the processor further executes instructions to:
select, from the first sequence number set of the M uncoded bits in a normal order or a reverse order, K sequence numbers as the sequence number set of the K information bits of to-be-encoded data.

14. The communications device according to claim 12, wherein the processor further executes instructions to:
after the selecting, from the first sequence number set of the M uncoded bits according to the preset first selection rule, the K sequence numbers as the sequence number set of the K information bits, obtain, based on the target coded bit quantity M and preset second mapping relationship information, a second coded bit sequence number set corresponding to the target coded bit quantity M and whose quantity is $M_0$, wherein the second mapping relationship information indicates a one-to-one correspondence between a plurality of coded bit quantities and a plurality of coded bit sequence number sets, and a sequence number quantity of each coded bit sequence number set is greater than or equal to a coded bit quantity corresponding to the coded bit sequence number set, wherein $M_0 \geq M$, and $M_0$ is a positive integer; and
select, from the second coded bit sequence number set according to a preset second selection rule, N sequence numbers as sequence numbers of the N transmission bits, wherein the sequence numbers of the N transmission bits are used to represent positions of the N transmission bits in the M coded bits.

15. The communications device according to claim 14, wherein
when $M_0=M$, the second coded bit sequence number set comprises sequence numbers that are of the M coded bits and that are arranged in a normal order, a reverse order, or a bit-reverse order; or
when $M_0>M$, the second coded bit sequence number set comprises all or some of sequence numbers of the M coded bits, wherein the second coded bit sequence number set has at least ($M_0-M$) duplicate sequence numbers.

16. The communications device according to claim 14, wherein
when $N \leq M_0$, select, from the second coded bit sequence number set in a normal order or a reverse order, the first N sequence numbers as the sequence numbers of the transmission bits; or
when $N > M_0$, use, as the sequence numbers of the transmission bits, all sequence numbers that are selected from the second coded bit sequence number set in a normal order or a reverse order for a plurality of times and whose total quantity is N.

17. The communications device according to claim 12, wherein the processor further executes instructions to:
determine, based on the first sequence number set of the M uncoded bits, a third coded bit sequence number set that is of the M coded bits and whose sequence number quantity is M; and
select, from the third coded bit sequence number set according to a preset third selection rule, N sequence numbers as sequence numbers of the N transmission bits, wherein the sequence numbers of the N transmission bits are used to represent positions of the N transmission bits in the M coded bits.

18. The communications device according to claim 17, wherein the processor further executes instructions to:
arrange bit sequence numbers in the first sequence number set of the M uncoded bits in a normal order, a reverse order, or a bit-reverse order, to generate the third coded bit sequence number set.

19. The communications device according to claim 17, wherein the processor further executes instructions to:
select, from the third coded bit sequence number set in a normal order or a reverse order, the first N sequence numbers as the sequence numbers of the transmission bits when $N \leq M$; or
use, as the sequence numbers of the transmission bits, all sequence numbers that are selected from the coded bit sequence number set in a normal order or a reverse order for a plurality of times and whose total quantity is N when $N > M$.

* * * * *